United States Patent
Richards et al.

(10) Patent No.: US 6,304,623 B1
(45) Date of Patent: Oct. 16, 2001

(54) PRECISION TIMING GENERATOR SYSTEM AND METHOD

(75) Inventors: James L. Richards, Fayetteville, TN (US); Preston Jett, Huntsville; Larry W. Fullerton, Brownsboro, both of AL (US); Lawrence E. Larson, Del Mar; David A. Rowe, Torrance, both of CA (US)

(73) Assignee: Time Domain Corporation, Huntsville, AL (US)

( * ) Notice: Subject to any disclaimer, the term of this patent is extended or adjusted under 35 U.S.C. 154(b) by 0 days.

(21) Appl. No.: 09/146,524

(22) Filed: Sep. 3, 1998

(51) Int. Cl.[7] ................................................. H04C 7/00
(52) U.S. Cl. .................................. 375/355; 375/371
(58) Field of Search ................... 375/354, 355, 375/360, 376, 708, 371, 373; 327/291, 156, 105

(56) References Cited

U.S. PATENT DOCUMENTS

| | | | |
|---|---|---|---|
| 4,641,317 | 2/1987 | Fullerton | 375/1 |
| 4,657,406 | 4/1987 | Yaeda | 368/120 |
| 4,743,906 | 5/1988 | Fullerton | 342/27 |
| 4,813,057 | 3/1989 | Fullerton | 375/37 |
| 4,979,186 | 12/1990 | Fullerton | 375/23 |
| 5,282,227 | * 1/1994 | Crawford | 375/327 |
| 5,363,108 | 11/1994 | Fullerton | 342/27 |
| 5,563,605 | 10/1996 | McEwan | 342/202 |
| 5,677,927 | 10/1997 | Fullerton et al. | 375/200 |
| 5,687,169 | 11/1997 | Fullerton | 370/324 |
| 5,832,035 | 11/1998 | Fullerton | 375/210 |
| 5,870,002 | * 2/1999 | Ghaderi et al. | 331/17 |
| 5,986,483 | * 11/1999 | Yu et al. | 327/107 |
| 6,088,414 | * 7/2000 | Dove et al. | 375/376 |
| 6,101,197 | * 8/2000 | Keeth et al. | 370/517 |
| 6,137,372 | * 10/2000 | Welland | 331/117 R |

FOREIGN PATENT DOCUMENTS 0 600 815 A2   6/1994   (EP) .

* cited by examiner

*Primary Examiner*—Tesfaldet Bocure
(74) *Attorney, Agent, or Firm*—Sterne, Kessler, Goldstein & Fox P.L.L.C.

(57) ABSTRACT

A frame reference signal is produced as a function of a clock signal. A first timing generator generates a coarse timing signal having a nominal period and a transition occurring at a precise temporal position with respect to the nominal period. The nominal period is a function of the frame reference signal. The temporal position is a function of a first input timing command and the clock signal. A second timing generator generates at least one fine timing transition as a function of a second input timing command and the clock signal. A combiner circuit uses the coarse timing signal to select one of the at least one fine timing transitions to output a precise timing signal, wherein the precise timing signal has a high temporal precision with respect to the frame reference signal.

30 Claims, 25 Drawing Sheets

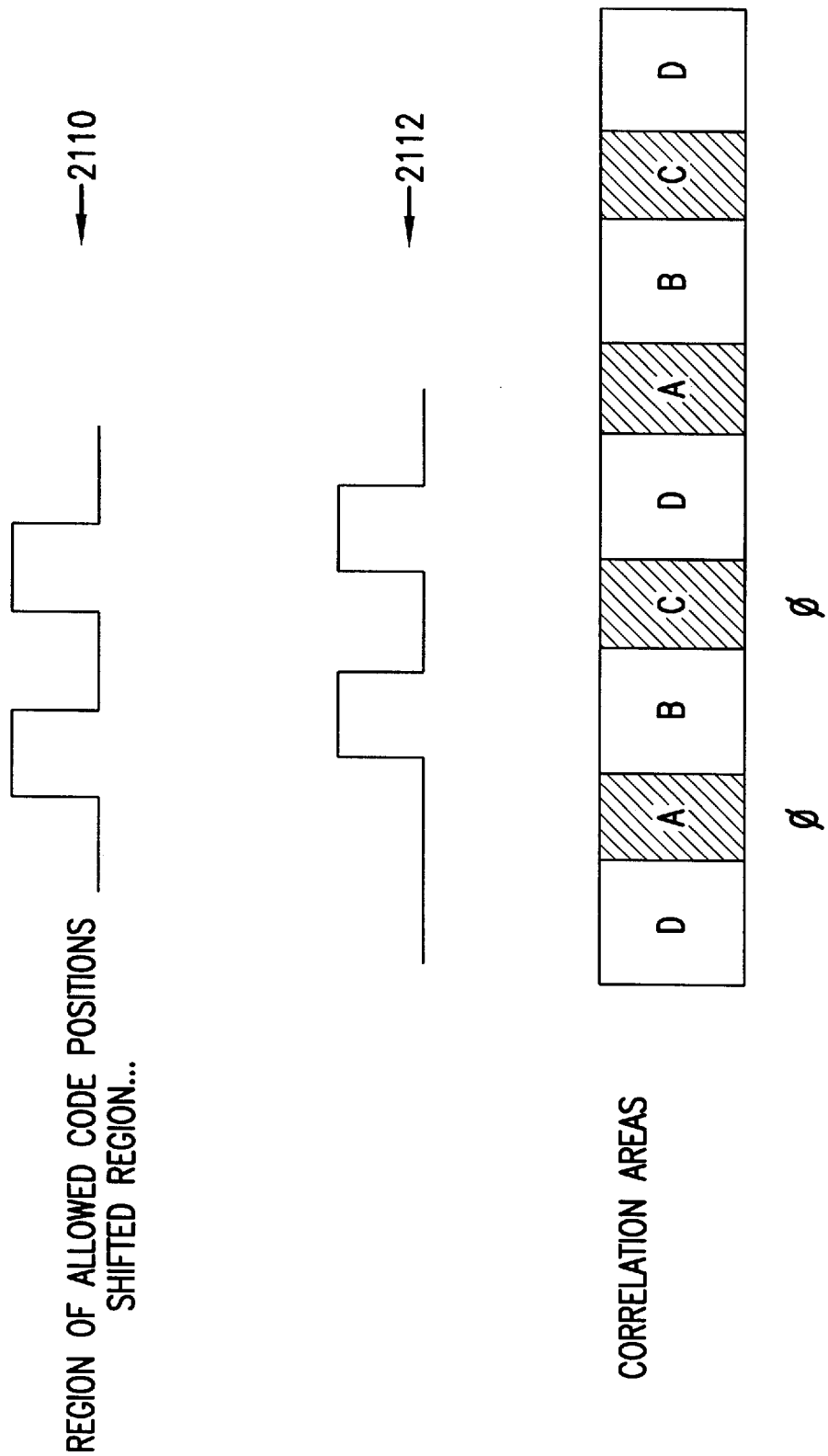

PRECISION TIMING GENERATOR SYSTEM AND METHOD

BACKGROUND OF THE INVENTION

1. Field of the Invention

This invention generally relates to radio systems and, more specifically, to a precision timing generator for impulse radio technologies, such as communication systems, radar, and security systems.

2. Related Art

Recent advances in communications technology have enabled communication systems to provide ultra-wideband communication systems. Among the numerous benefits of ultra-wideband communication systems are increased channelization, resistance to jamming and low probability of detection.

The benefits of ultra-wideband systems have been demonstrated in part by an emerging, revolutionary ultra-wideband technology called impulse radio communications systems (hereinafter called impulse radio). Impulse radio was first fully described in a series of patents, including U.S. Pat. No. 4,641,317 (issued Feb. 3, 1987), U.S. Pat. No. 4,813,057 (issued Mar. 14, 1989), U.S. Pat. No. 4,979,186 (issued Dec. 18, 1990), U.S. Pat. No. 5,363,108 (issued Nov. 8, 1994) and U.S. Pat. No. 4,743,906 (issued May 10, 1988) all to Larry W. Fullerton. A second generation of impulse radio patents includes U.S. Pat. No. 5,677,927 (issued Oct. 14, 1997), U.S. Pat. No. 5,687,169 (issued Nov. 11, 1997) and co-pending application Ser. No. 08/761,602 (filed Dec. 6, 1996; now allowed) to Fullerton et al. These patent documents are incorporated herein by reference.

Basic impulse radio transmitters emit short Gaussian monocycle pulses with tightly controlled pulse-to-pulse intervals. Impulse radio systems use pulse position modulation, which is a form of time modulation in which the value of each instantaneous sample of a modulating signal is caused to modulate the position of a pulse in time.

For impulse radio communications, the pulse-to-pulse interval is varied on a pulse-by-pulse basis by two components: an information component and a pseudo-random (PN) code component. Generally, spread spectrum systems make use of PN codes to spread the information signal over a significantly wider band of frequencies. A spread spectrum receiver correlates these signals to retrieve the original information signal. Unlike spread spectrum systems, the PN code for impulse radio communications is not necessary for energy spreading because the monocycle pulses themselves have an inherently wide bandwidth. Instead, the pseudo-random code of an impulse radio system is used for channelization, energy smoothing in the frequency domain, and jamming resistance (interference rejection.)

Generally speaking, an impulse radio receiver is a homodyne receiver with a cross correlator front end. The front end coherently converts an electromagnetic pulse train of monocycle pulses to a baseband signal in a single stage. The data rate of the impulse radio transmission is typically a fraction of the periodic timing signal used as a time base. Each data bit time position usually modulates many of the transmitted pulses. This yields a modulated, coded timing signal that comprises a train of identically shaped pulses for each single data bit. The cross correlator of the impulse radio receiver integrates multiple pulses to recover the transmitted information.

In an impulse radio communication system, information is typically modulated by pulse-position modulation. That is, the time at which each pulse is transmitted is varied slightly from the predetermined pulse-to-pulse interval time. One factor limiting the effectiveness of the communication channel is the accuracy with which the pulses can be positioned. More accurate positioning of pulses can allow the communication engineer to achieve enhanced utilization of the communication channel.

For radar position determination and motion sensors, including impulse radio radar systems, precise pulse positioning is crucial to achieving high accuracy and resolution. Limitations in resolution of existing systems are partially a result of the limitations in the ability to encode a transmitted signal with a precisely timed sequence. Therefore, enhancements to the precision with which timing signals can be produced can result in a higher-resolution position and motion sensing system.

Impulse radio communications and radar are but two examples of technologies that would benefit from a precise timing generator. A high-precision timing generator would also find application in any system where precise positioning of a timing signal is required.

Generating such high precision pulses, however, is quite difficult. In general, high precision time bases are needed to create pulses of short duration having tightly controlled pulse-to-pulse intervals. Currently available analog or digital integrated circuit timers are not capable of creating such high precision pulses. Typical impulse radio timer systems are relatively complex, expensive, board level devices that are difficult to produce. A small, low power, easily produced, timer device would enable many new impulse radio-based products and bring their advantages to the end users.

SUMMARY OF THE INVENTION

The present invention relates to a timing generator that provides highly accurate, stable, low jitter, and agile timing signals in response to a rapidly changing timing command input. Such signals are needed for UWB transceiver and radar devices as well as numerous other applications in industry and instrumentation.

Timing signals generated in accordance with this invention result in a signal transition at a precisely spaced (delayed) time relative to a time framing signal also generated by the system. The framing signal is typically slaved to a stable reference. In one embodiment, a phase locked loop (PLL) is used to accomplish this function. If the timing command meets certain setup time requirements, the output timing signal transition will be placed at a precise time relative to the associated frame signal transition. An early/late command input signal and associated mechanism are included to permit 100% time command coverage-free of gaps caused by setup time or metastable restrictions.

The invention utilizes a coarse timing generator and a fine timing generator to accomplish this goal. The coarse timing generator is utilized to define the framing interval and to further subdivide the framing interval into coarse timing intervals. The fine timing generator is used to define the time position between coarse timing intervals.

The coarse timing generator utilizes a high-speed synchronous counter, an input command latch and a digital comparator. One embodiment permits latching the input command at several points to permit 100% timing coverage. Another embodiment includes selectable counter lengths to scale the system to different frame rates and different reference timer frequencies. These setup parameters can be loaded using a serially loadable command register.

The fine delay generator is based on a phase shift circuit. Two example embodiments are described. One is based on a sine/cosine multiplier phase shift circuit; the other is based on an RLC switched element phase shift circuit. The sine/cosine multiplier circuit utilizes a sine wave version of the coarse delay clock together with analog voltages representing the sine and cosine of the desired phase shift angle to produce a sine wave timing signal shifted in time (phase) fractionally between two coarse delay intervals. In one embodiment, the fine timing generator uses an analog command input and as a result has a continuous rather than quantized transfer function. In another embodiment, the fine timing input is digital and is mapped through a memory device that drives a digital-to-analog converter (DAC) to produce the correct timing associated with the digital input command. This signal is combined with the coarse delay signal to produce the output delay signal, which is the sum of the two delays. In one embodiment, the delay generator contains two sets of sine/cosine generators to permit 100% timing coverage.

A unique advantage of the combiner circuit is that the coarse delay signal may have errors much larger than the final timing requirement. The coarse delay signal is only used to select among several fine delay signals. The fine delay signals determine the precision of the output.

An alternate embodiment of the phase shifter utilizes switched lumped element phase networks. This arrangement takes a direct digital input and does not need a DAC or a sine/cosine lookup table.

One embodiment of this invention implements the coarse and fine delay sections in a SiGe ASIC (chip) and partitions the system such that random access memories (RAM's) and digital-to-analog converters (DAC's) are external to the ASIC. In this embodiment, further advantages result from implementing the circuitry in fully differential current steering logic and differential analog amplifiers such that the chip draws a constant current independent of clock frequency. This minimizes on-chip transients that could introduce jitter in the output.

One of the unique challenges of UWB transceivers is that they not only need stable and accurately timed pulses, typically to 30 picoseconds (ps) and stable over millisecond (ms) correlation intervals, but the timing needs to change dramatically from pulse to pulse. This interval may be on the order of 100 nanoseconds (ns) and needs to be accurate to fractional parts per thousand relative to an implementation-specific standard 100 ns frame interval. This invention has demonstrated the ability to meet these timing requirements and when implemented in ASIC form, it enables the production of relatively economical UWB systems.

For simplification, the invention is described by referring to diagrams that are single ended, but the preferred implementation is to use differential circuits. Various input and output signals are shown as differential.

An advantage of the invention is that timing pulses can be precisely positioned in time to a high degree of accuracy. As a result, advancements in communication technology can be realized. For example, in a communication system utilizing pulse position modulation, gains can be achieved in coding and bandwidth by taking advantage of the ability to more precisely position the timing of the pulses in the nominal period.

Additionally, because precise positioning can be achieved over the entire nominal period, the entire period can be utilized for communication, thereby resulting in increased channelization of the communication system.

Advantages are also realized in radar and motion sensor applications. More precise positioning of output pulses allows a higher resolution radar and motion sensor system.

Further features and advantages of the present invention, as well as the structure and operation of various embodiments of the present invention, are described in detail below with reference to the accompanying figures.

BRIEF DESCRIPTION OF THE FIGURES

The present invention is described with reference to the accompanying figures. In the figures, like reference numbers indicate identical or functionally similar elements. Additionally, the left-most digit(s) of a reference number identifies the figure in which the reference number first appears.

FIGS. 21A, 21B, and 21C illustrate code mapping and timing considerations in a system designed without the E/L function in accordance with another embodiment of the present invention;

DETAILED DESCRIPTION OF THE PREFERRED EMBODIMENTS

1. Overview and Discussion of the Invention

The present invention is directed to a system and method for generating highly agile and precise timing signals as are typically required for impulse radio systems. According to the invention, a coarse timing generator is utilized to generate a coarse timing signal at a coarse time interval within a nominal frame interval. A fine timing generator, synchronized to the coarse timing generator, provides a set of fine time intervals that interpolate between coarse time intervals. A combining circuit utilizes the coarse timing signal to select the correct fine timing signal that drives the output. This system is typically phase locked to a stable reference oscillator source, which provides good long term drift performance. In an exemplary application, this system is capable of providing timing for near 10 ps positioning of sub-nanosecond pulses with in a 100 ns frame with less than 50 ns setup time. This timing is needed for pseudo random code positioning of pulses in impulse radio communications and radar equipment, and the like.

2. Significance of the Invention

Before describing the invention in detail, it is useful to describe two example scenarios in which the invention finds utility. These scenarios are provided as an example only and as an aid in understanding potential applications of the invention. It is not intended that the invention be limited to application in these scenarios. In fact, in a broad sense, the invention can be implemented in any system requiring or desiring a precision timing signal or a precision time delay means. Thus, the invention is well suited to high-speed computer applications and ultra-wideband communications systems. The precision provided by the time generator according to the invention is especially beneficial to impulse radar and communication systems, although, as indicated above, its application is not limited to such systems.

Figure 1A:
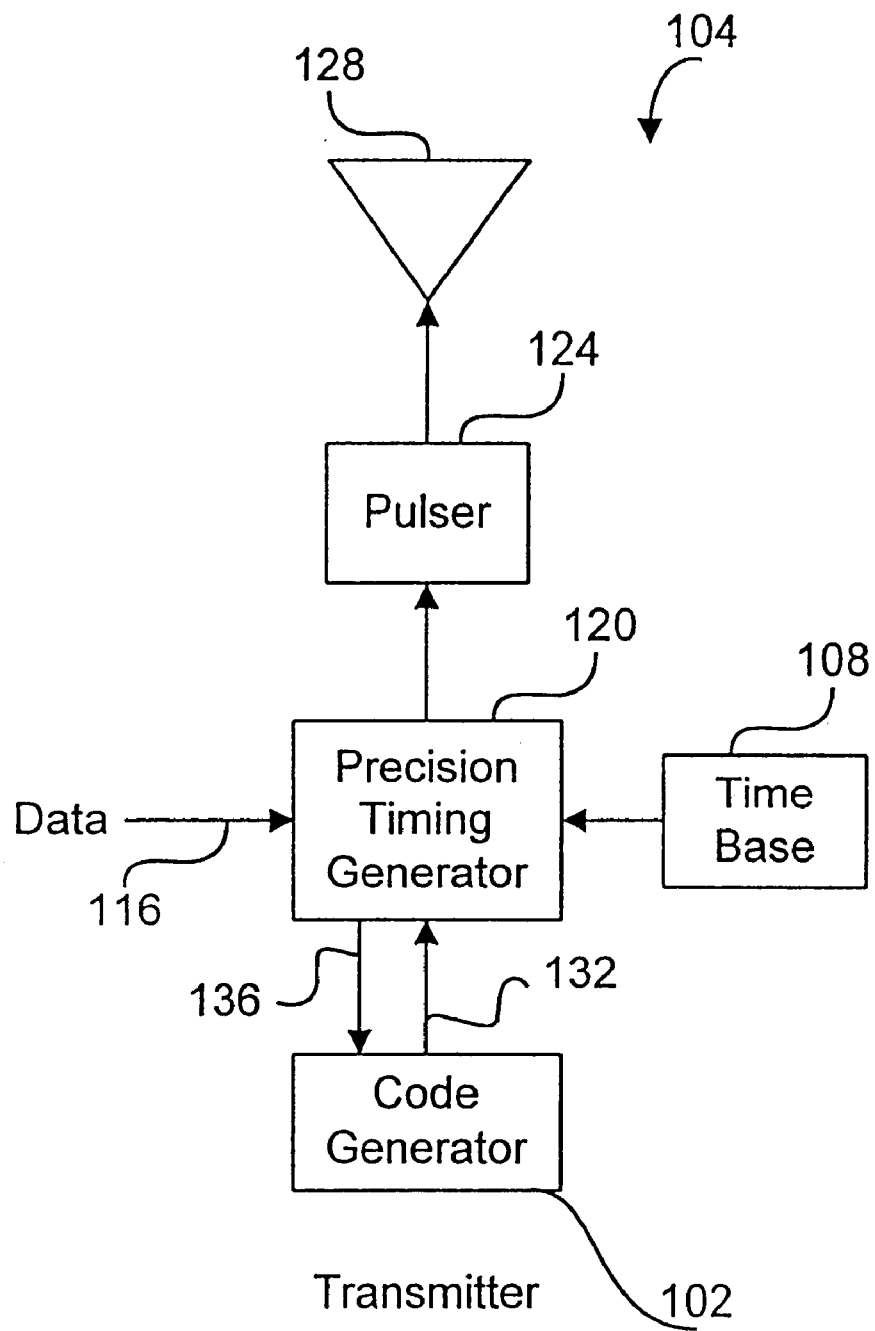
FIGS. 1A and 1B are block diagrams of an impulse radio transmitter and receiver, respectively, which comprise an example communication system that uses the present invention.
Figure 1B:
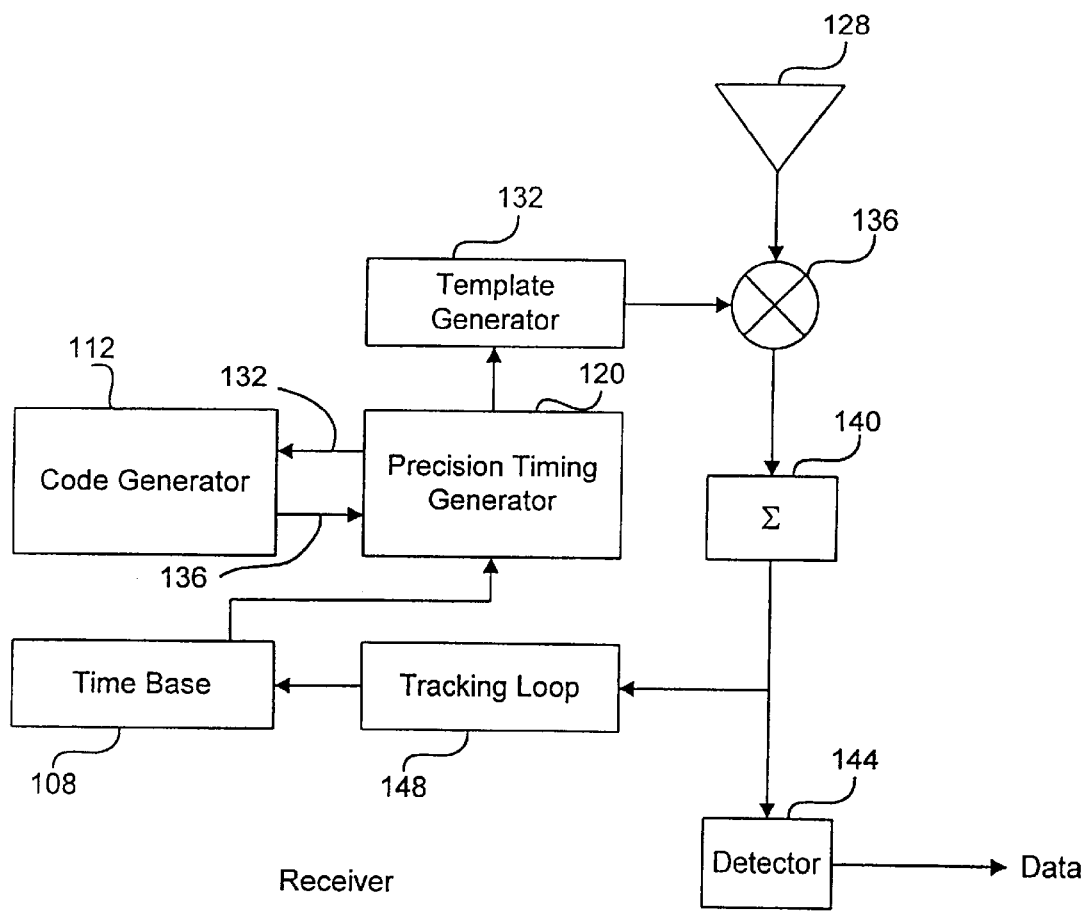

FIG. 1 is a simplified block diagram illustrating an example of an ultra-wideband (e.g., impulse radio) communication system. Referring now to FIG. 1A, the impulse radio communication system includes a transmitter 104 (which could be a stand-alone transmitter, or the transmit portion of a transceiver), and a receiver FIG. 1B 108 (which could be a stand-alone receiver, or the receive portion of a transceiver).

Figure 2A:
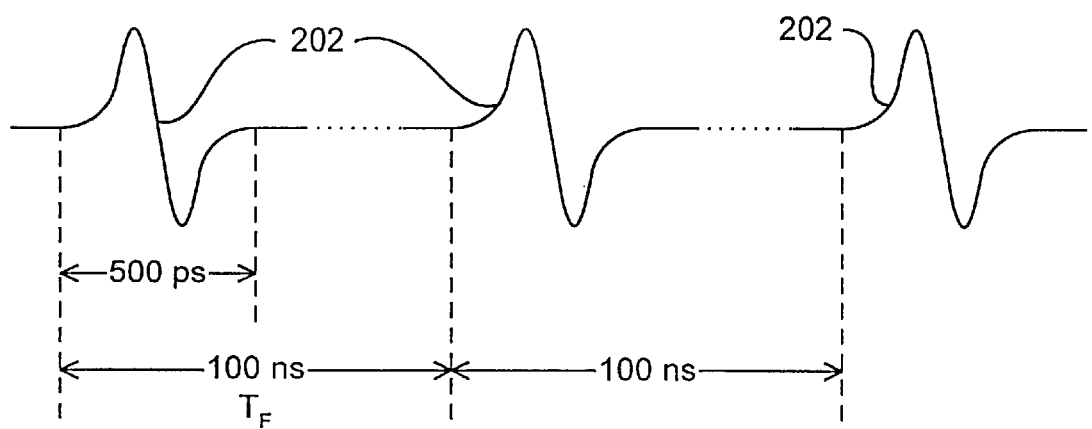
FIGS. 2A and 2B illustrate an unmodulated pulse train and a nominal periodic occurrence of a pulse, respectively.

Without modulation, transmitter 104 transmits a periodic series of pulses spaced at a predefined time interval. Data is modulated onto this series by altering the time at which the pulses are positioned. This can be referred to as pulse-position modulation. FIG. 2A is a diagram illustrating an unmodulated pulse train. In the example illustrated in FIG. 2A, pulses are transmitted at periodic intervals indicated by the reference character $T_F$. For example, for an unmodulated pulse train, each pulse can be timed to occur every 100 ns, although other periods may be chosen. In this document, the period is referred to as a frame. Thus, each frame is 100 ns long.

Pulses, however, are not usually transmitted at regular frame intervals because this gives rise to a comb line spectrum where each line contains too much concentrated spectral power. To avoid this, the pulses are transmitted at random or pseudo-random intervals within the frame to "randomize" the pulse position and spread the comb lines to smooth the spectrum. To maintain synchronization between a transmitter and receiver, these pulses must be positioned to within 1/10 wave at the center frequency of the pulse and for best performance, the pulse should be agile enough to be placed anywhere within the frame. In addition, frame to frame positioning should have minimum correlation. The present invention relates to a timing system that can provide this timing.

Figure 2B:
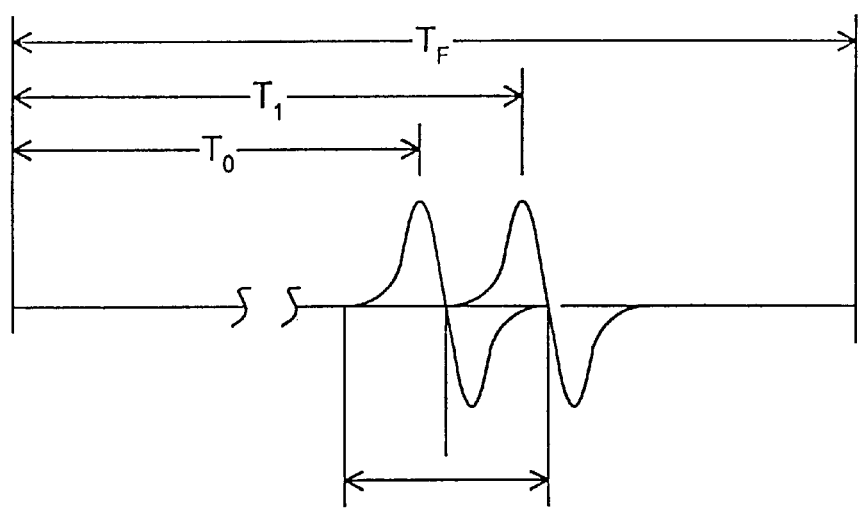

In a communications system, it is also necessary to add modulation to the signal. This can be done with AM, FM, pulse position modulation, and other methods described in the referenced patents. Typically pulse position modulation is chosen for its simplicity and efficiency. An example is shown in FIG. 2B. Referring to FIG. 2B, T0 is the nominal pulse position defined by the code offset as described above. T1 is a pulse position with an additional offset due to modulation. A typical system may transmit a pulse at position T0 for data=0 and at T1 for data=1. For this system to work, the timing generator must be capable of providing timing to much greater precision than the modulation time shift in order to maintain good signal to noise.

Additional benefits can be obtained by using more than one pulse to represent one digital information bit. The received signal from the ensemble of pulses associated with each bit is combined in a process referred to as integration gain. The combination process is basically the summation of the received signal plus noise energy associated with each pulse over the number of pulses for each bit. The voltage signal-to-noise ratio improves roughly by the square root of the number of pulses summed. Proper summation requires that the timing be stable and accurate over the entire integration (summation) time.

Referring again to FIG. 1A, time base 108 drives the precision timing generator 120 and ensures long term stable operation. A code generator 112 provides a new time offset command for each new time frame. A time framing clock (also referred to as a reference clock) is provided to the code generator from the timing generator. Data is supplied to the precision timing generator 120, which modulates the timing in accordance with the data. The timing output signal is supplied to a pulser 124, which generates the RF pulse to be transmitted by an antenna 128.

FIG. 1B is a block diagram of an example impulse radio receiver. Referring to FIG. 1B, the time base 108 (same or duplicate of 108 in the receiver 104) drives the precision timing generator 120 which provides long term stability, much as in the transmitter FIG. 1A described above, except in this case, the time base 108 must be locked to the transmitter in periodicity and time offset. The code generator 112 provides time offset commands identical to the code set driving the transmitter. The resulting timing signals drive a template generator 132 that produces a correlation template signal that matches the shape of the signal received by the antenna 128. (Note that correlation includes sampling and implies signal integration over the aperture time of a correlator/sampler 136.) The correlation signals from the ensemble of pulses comprising one data bit are summed in a summing accumulator 140. The output of the accumulator 140 is typically sampled at the end of the integration cycle by a detector (e.g., comparator) 144 to determine if the data bit is a one or a zero. The correlation signal also feeds a tracking loop filter 148, which keeps the receiver time base 108 in lock step with the received signal. Additional detail and variations may be found in the referenced patents.

Figure 3:
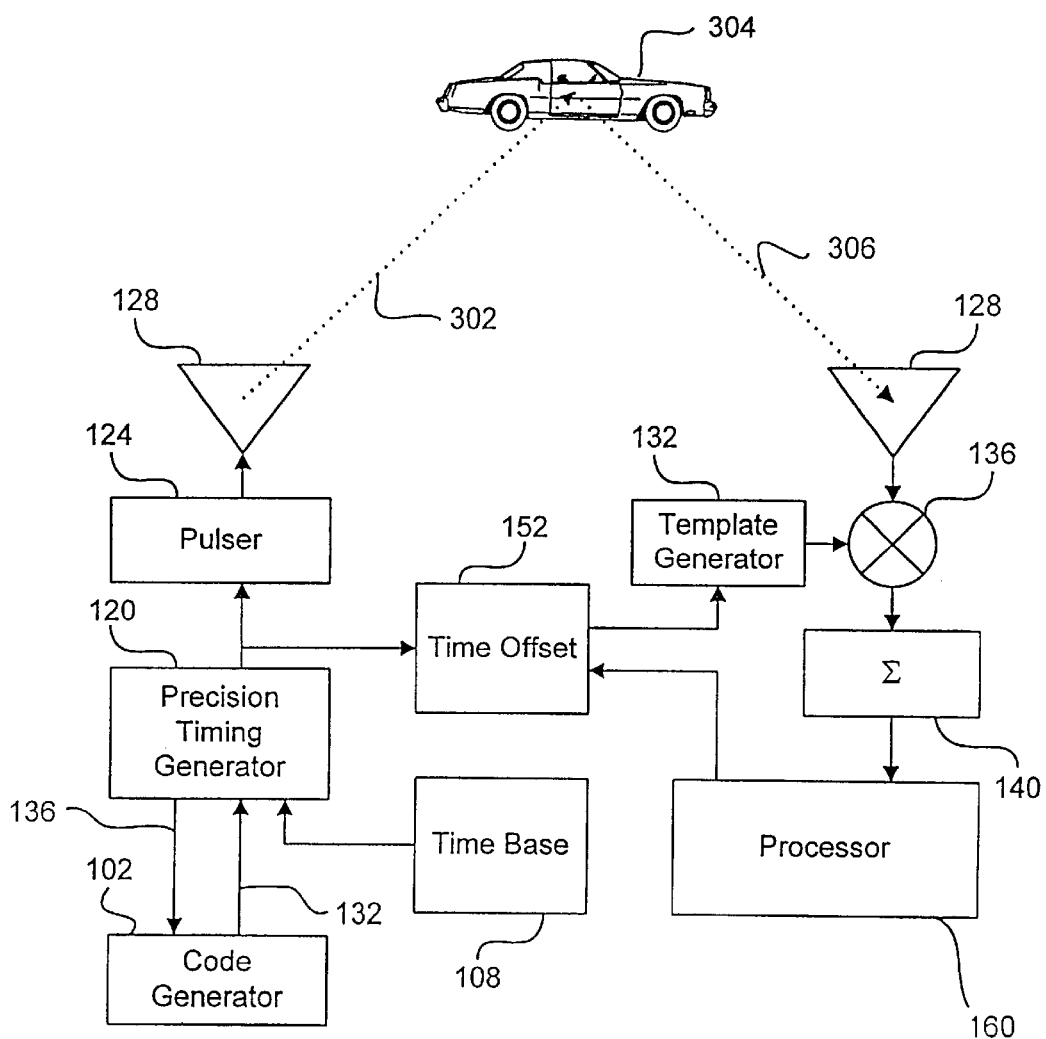
FIG. 3 is a block diagram of an example impulse radar sensor, which uses the present invention.

Consider now an impulse radar position or motion sensor application. FIG. 3 is a simplified block diagram illustrating an ultra-wideband radar sensor. The impulse radar sensor operates by transmitting a pulse toward a target and receiving the reflected pulse by the receiver at a delayed time determined by the offset time. This offset time determines an equivalent range of sensitivity that is referred to as the range gate. A typical impulse radar sums the return signal from a large number of pulses to improve signal to noise and thus the operating range achievable for a given pulse energy.

Referring to FIG. 3, the time base 108 drives the precision timing generator 120 with a stable clock. The code generator 102 supplies pseudo-random time offsets that are used to spread the comb spectrum of the transmitted pulses and provide for simultaneous operation of multiple radars. Multiple radars may be operated in the same area by setting each one to operate using different codes or different pulse frequencies. Other methods are disclosed in the referenced patents. The precision timing generator 120 delivers a timing pulse to the pulser 124 according to the code generator input. The pulser 124 delivers an RF pulse 302 to the antenna 128, which is directed to a target 304 and a reflected pulse 306 is received by the receiving antenna 128 and fed to the correlator 136. The correlator 136 is also fed a template signal (from template generator 132), which is delayed a specific amount from the time of the transmitted pulse. This delay is provided to the template generator 132 by a time offset block 152. The result of the correlation of the received signal with the template signal is fed to the pulse summation accumulator 140. The result of multiple pulses is fed to the processing circuitry (or computer) 160 where the signal is processed and detected. In some cases the signal is simply displayed, in other cases the signal is subtracted from a stored memory of the long term history to detect motion or changes. Further details as well as architecture and algorithm variations may be found in the referenced patents.

Thus, the impulse radio system and impulse radar system are examples of two systems that would benefit from a high-precision time base according to the present invention. The reader is again reminded that the application of the precision time base disclosed herein is not limited to these two example systems, and, in fact, is not limited to application in ultra-wideband systems. After reading the description provided herein, it will become apparent to a person skilled in the relevant art how to implement the invention in alternative systems and environments.

3. The Present Invention

Figure 4:
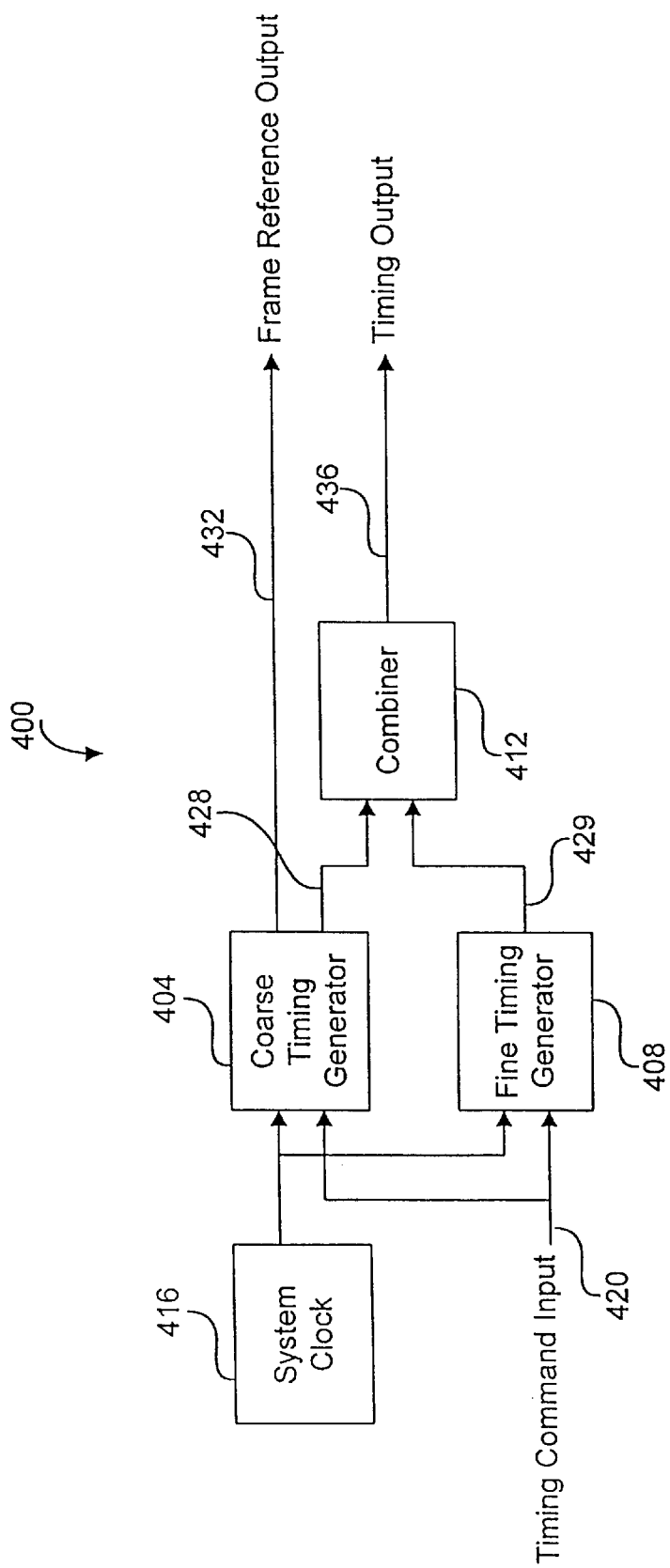
FIG. 4 illustrates a block diagram of a precision timing generator in accordance with the present invention.

FIG. 4 is a block diagram illustrating a precision timing generator 400 according to the present invention. Precision timing generator 400 corresponds to block 120 of the earlier described figures. Turning now to FIG. 4, the timing generator 400 includes a coarse timing generator 404, a fine timing generator 408, and a combiner 412. A system clock signal 416 and a timing command input 420 drive the coarse and fine timing generators. Depending on the embodiment, the system clock 416 can be self contained as part of the timing generator 400, or it can be an external input. The system clock 416 generates a CLK signal at a first frequency. The timing command input 420 is a data word specifying a desired delay value, as will be discussed at length below. The coarse timing generator 404 generates a frame reference signal 432 and a coarse timing signal 428. The coarse timing signal 428 subdivides intervals of the frame reference signal 432 into relatively coarse time intervals. The fine timing generator 408 generates a fine timing signal 429 that subdivides the coarse timing interval into smaller intervals, or in one embodiment, a continuously variable interval. The fine timing generator 408 generally produces several time transitions resulting in ambiguity at the coarse time interval. The combiner circuit 412 selects the fine timing signal 429 associated with the coarse timing signal 428 so as to resolve this ambiguity and produce a precision timing output 436.

Figure 5:
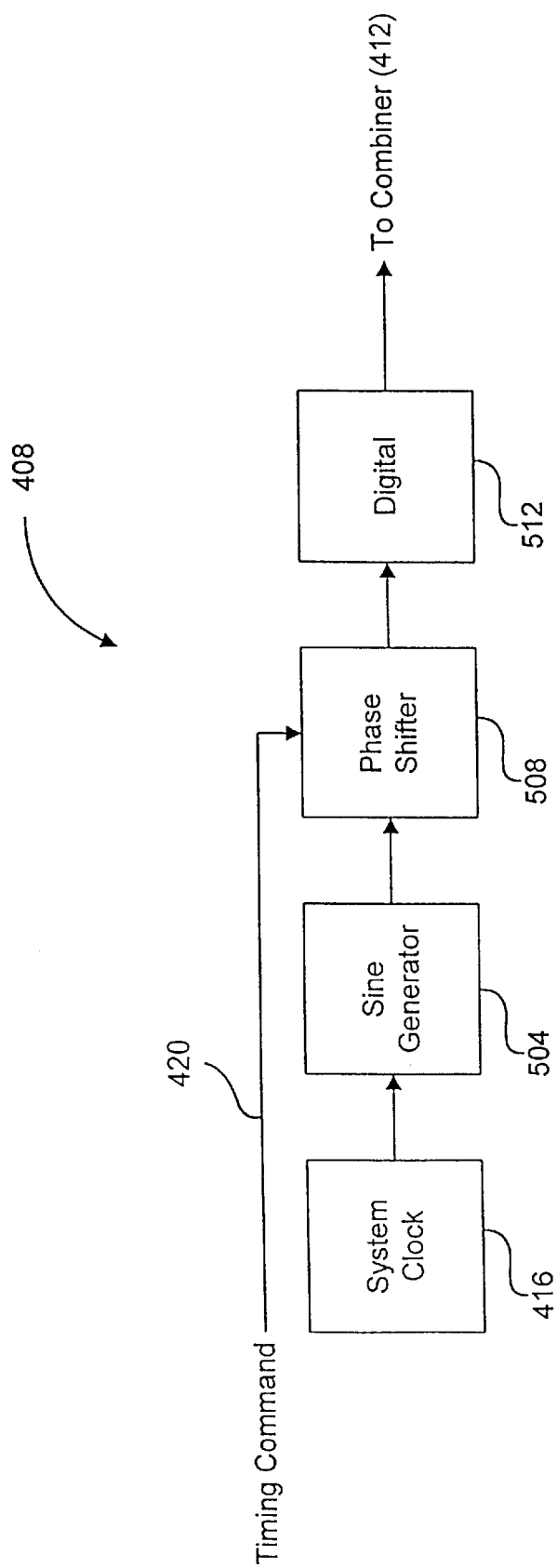
FIG. 5 is a more detailed diagram if the fine delay block of FIG. 4.

FIG. 5 is a block diagram of the fine timing generator 408. The clock signal 416 is used to generate a sine wave signal of the same frequency via a sine generator 504. The sine wave is typically created by a filter that strips the harmonics from the square wave digital signal. The sine wave version of the clock is then fed to a phase shifter 508. The phase shifter 508 shifts the phase of the sine wave according to a fine time component of the timing command input 420. A block 512 labeled "digital" converts the phase shifted sine wave into a square wave signal, which is forwarded to combiner 412.

In one embodiment, fine time component timing command input 420 comprises two analog DC level signals (static for the duration of a given phase shift value, but changed for a new phase shift value) representing the sine and cosine of the desired phase shift. In another embodiment the timing command is a set of digital lines representing a set of discrete delay values to be additively combined. These two examples are described in greater detail in the discussion of FIGS. 13 and 18. Alternative phase shift circuits are possible, as would be apparent to a person of ordinary skill in the art, without detracting from the advantages of either the broader or specific features of the present invention.

Figure 6:
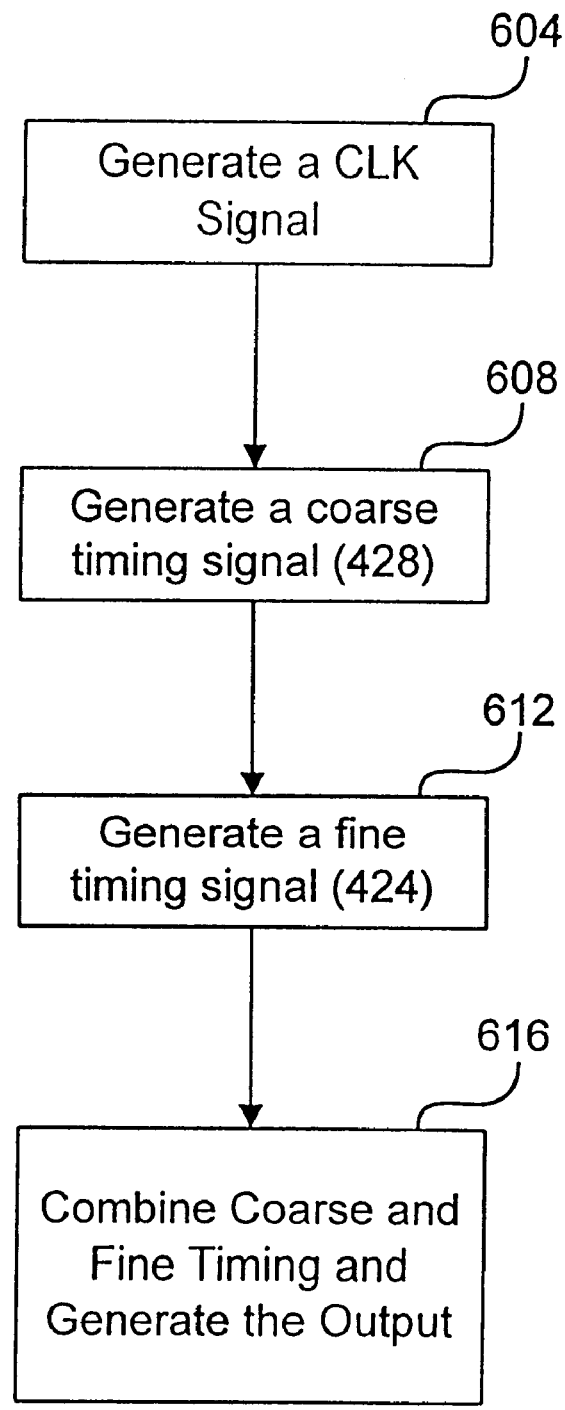
FIG. 6 is a flow diagram of the steps in FIG. 4.

FIG. 6 is a flow diagram illustrating the operation of the timing generator 400. Referring now to both FIGS. 4 and 5, in a step 604, the system clock 416 generates CLK signal at a first frequency. In a step 608, the coarse timing generator 404 generates a coarse timing signal 428. This coarse timing signal 428 is a signal relative to the frame reference signal 432 and is a function of the timing command input 420.

In a step 612, the fine timing generator 408 generates a series of fine timing signal transitions placed in time relative to the framing signal according to the timing command input 420.

In step 616, the combiner 412 selects one of the fine timing signal transitions according to the coarse timing signal 428 and outputs the resulting timing signal 436.

Figure 7:
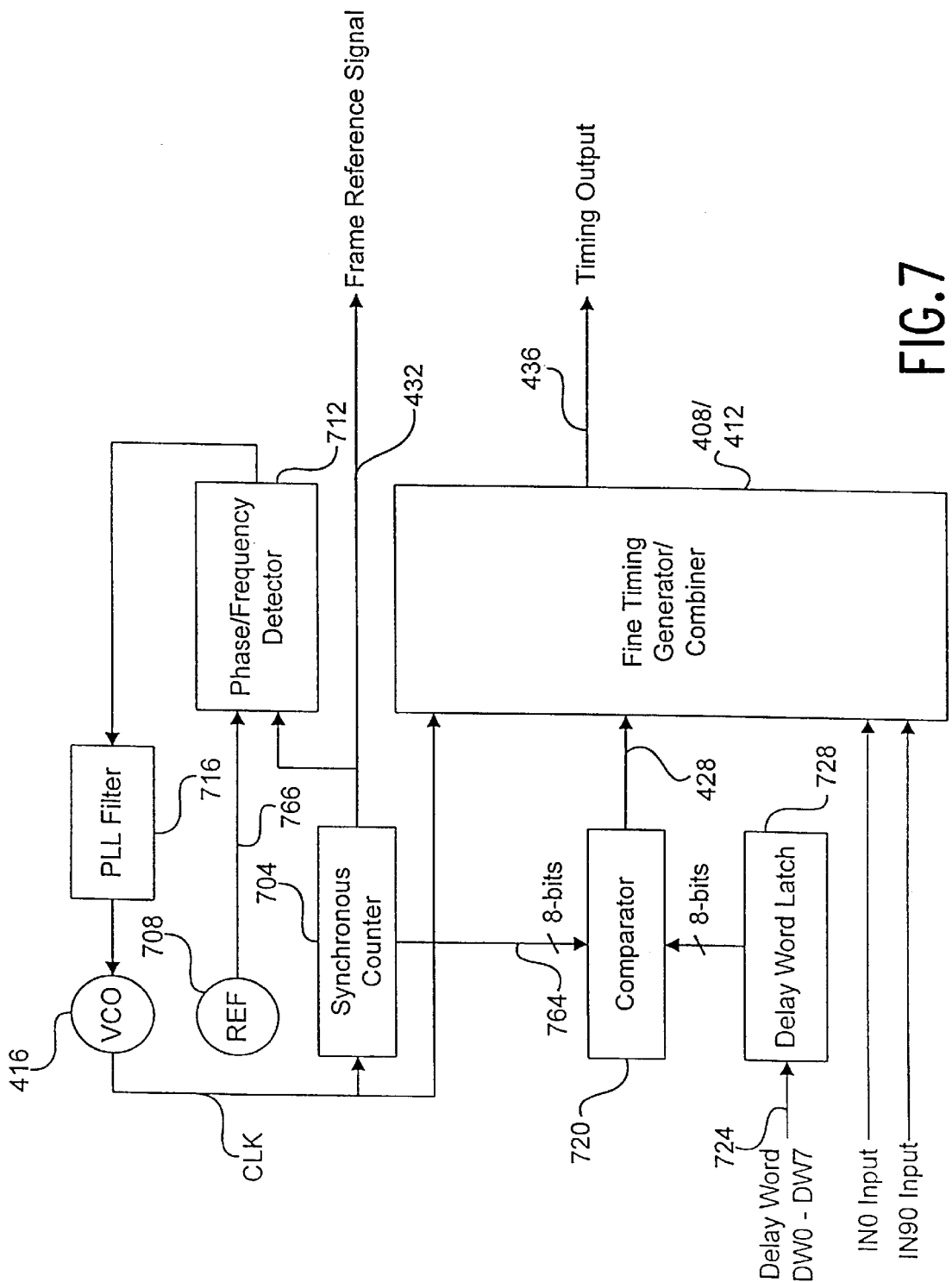
FIG. 7 illustrating an example implementation of a precision timing generator in accordance with an embodiment of the present invention.

FIG. 7 is a block diagram illustrating an example implementation for the precision timing generator 400. The timing generator 400 includes the system clock 416 (shown as a voltage controlled oscillator or VCO) that produces the CLK signal, a synchronous counter 704, a reference signal generator 708 (also referred to as a reference clock or REF CLK), a phase/frequency detector 712, a phase locked loop (PLL) filter 716, a comparator 720, a delay word latch 728. The fine timing generator 408 and combiner 412 are shown as a single block for simplicity.

In a preferred embodiment, the counter 704 is a synchronous counter that divides the CLK signal generated by system clock 416 into a lower-rate signal, which is the frame reference signal 432. Also, in a preferred embodiment, the comparator 720 is an eight bit comparator and the (delay word) latch 728 is an eight bit latch. The frame reference signal 432 defines an interval of time, so it is also referred to as a "frame interval." The frame interval is defined by the period of the most significant bit of the counter 704.

The counter 704 also outputs a count value 764. The count value 764 defines the coarse time interval. More specifically, the count value 764 indicates the number of periods 436 that have occurred in the current frame. In other words, the count value 764 indicates the amount of time elapsed since the beginning of the current frame.

In order to enable a user to select the timing of the coarse timing signal 428 (i.e., the timing of the occurrence of the coarse delay pulse in the preferred embodiment), the illustrated embodiment utilizes the comparator 720 and the latch 728. A count value 724 corresponding to a desired coarse time interval is loaded into the latch 728, as represented in the figure as coarse delay word DW0-DW7. The comparator 720 compares the value of DW0-DW7 latched in the latch 728 with the value in counter 704, as counter 704 counts pulses of VCO 416. When the value in the counter 704 matches the value in the latch 728, the coarse timing signal 428 changes state. In a preferred embodiment, the comparator 720 simply outputs the coarse timing signal 428 in the form of a coarse timing pulse.

The coarse timing signal 428 is used to enable the fine timing generator 408 to trigger at the next interval. The combiner 412 then produces the timing output 436.

One difficulty in implementing a high-precision timing generator is the availability of a stable and accurate frequency source at high frequencies. One especially troublesome characteristic of high frequency signal generators is the tendency to drift over time. However, for high speed, high resolution or wide bandwidth systems, high frequencies are often required.

In the present invention, the timing generator 400 utilizes a phase locked loop (PLL) to maintain the stability of the VCO 416. In the embodiment illustrated in FIG. 7, the PLL comprises the phase/frequency detector 712 (simply referred to as the phase detector), the REF CLK 708 and the PLL filter 716. Accuracy and stability are provided by phase locking the VCO 416 to a very precise REF CLK 708. At frequencies such as, for example, 10 MHZ, extremely stable and accurate reference signal generators are commercially available (e.g., a crystal oscillator).

The phase detector 712 compares and synchronizes the output of the synchronous counter (frame reference signal 432) with a reference signal 766 generated by the REF CLK 708. Because the frame signal 432 is divided down from the pulse repetition frequency (i.e., 416's CLK signal), the phase detector 712, and hence the REF CLK 708 operate at this much lower frequency. The phase detector 712 outputs an error signal, which is received by the PLL filter 716. The PLL filter 716 adjusts the VCO 416 so that the VCO is synchronized to the REF CLK 708. In a preferred embodiment, the phase detector is a phase/frequency type of detector known to those skilled in the art (e.g., Motorola MC14046). This detector allows a wide lock-in range and ensures a deterministic lock-in of the VCO.

To further clarify the operation of the precision timing generator 400, consider the following example. In a system with a 100 ns frame interval, the inventors desire to produce a timing signal delayed 56 ns after the 100 ns frame signal. The 100 ns frame interval is divided into 256 coarse delay intervals of 390.6 ps each. The coarse delay value would then be the integer part of (56*100/256), which is 21. The fine delay value would be the remainder, which is 0.875. The fine delay value would be used to select 0.875 of a cycle at the coarse delay rate. Thus, an "In0" value from a sine lookup table (described below) would be In0=sin(2*pi*0.875)=−0.707 and an "In90" value from a cosine table would be In90=cos(2*pi*0.875)=0.707. Typically these values are read from a sin/cos lookup table and applied to a digital-to-analog (DAC; described in detail below), whereupon the resulting analog voltage is applied to the In0 and In90 inputs of the time delay system (also to be described in detail below). If there is a fixed time delay offset between the coarse delay system and the fine delay system, this can be accounted for by adding a phase angle correction factor to the above equations.

Figure 8:
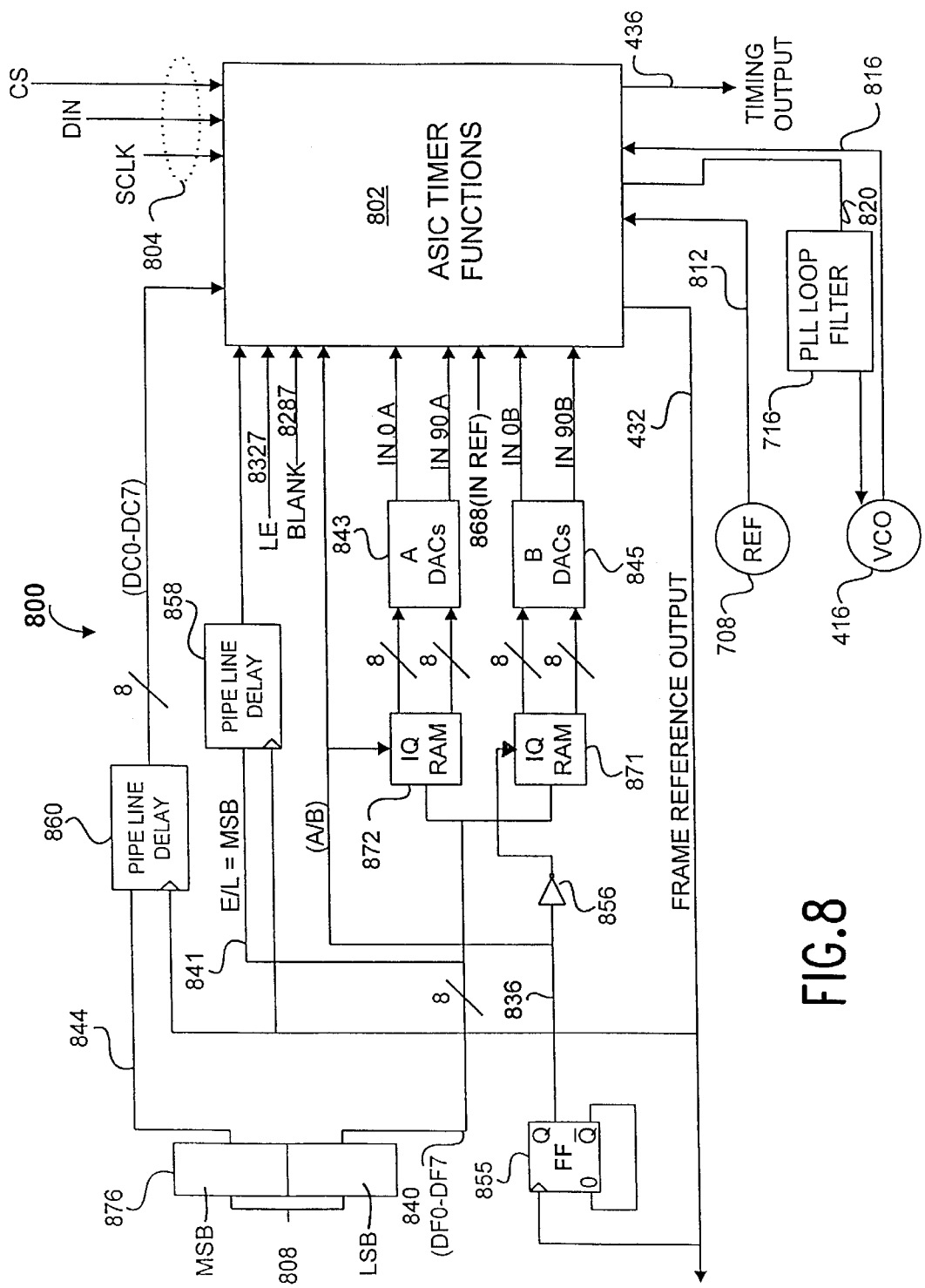
FIG. 8 illustrates a block diagram of a precision timing generator implemented using an ASIC, in accordance with the present invention.

FIG. 8 is a diagram of one embodiment in which a portion of the timing circuitry is implemented using an ASIC chip 802. FIG. 8 illustrates how the system can be partitioned for optimum match with ASIC and component technology. In this diagram the coarse delay 404, fine delay 408 and combiner 412 functions are on the SiGe chip 802 and DAC, RAM and VCO functions are off chip. This allows maximum use of conventional technology for DAC's and RAM's, while focusing the power of the SiGe process on the timing functions. This has the added advantage of separating RAM and DAC transients from the sensitive timing of ASIC 802. In keeping with this architecture the VCO 416's input, and timing and frame clock outputs are differential signals to help reduce common mode noise coupling, which can influence jitter. These signals are not shown as differential in this figure for simplicity.

Additional advantages can be obtained by implementing the ASIC circuits in differential form. The logic is implemented in fully differential current steering logic and the analog circuits include differential amplifiers and filters such that the chip draws a constant current independent of clock frequency. This minimizes on-chip transients that could introduce jitter in the output. These circuits will be apparent to one skilled in the art, and indeed example circuits that can be adapted to SiGe are substantially available in several cell libraries. However, for completeness, as example SiGe differential AND gate is described below in connection with FIG. 22.

Referring now to FIG. 8, a 16 bit delay value 808 is input to the timing system 800 for each cycle of frame reference output 432 in which a timing signal is desired. The delay value 808 is stored in a register 876. The most significant bits (MSB's) are provided directly to a coarse delay latch (described below as 936) in the ASIC 802. The MSB's comprise a coarse delay word 840 (DC0–DC7) 824. The least significant bits (LSB's) comprise a fine delay word (DF0–DF7), and are converted to analog levels via IQ RAM's 872,871 and DAC's 843,845. An E/L signal 841 is the specific MSB of DF0–DF7.

An ASIC serial bus 804 is a 3 wire input with Data In (DIN), shift Clock (SCLK), and Chip Select (CS) signals. The serial bus 804 is made to operate in a slave mode, with SCLK is provided to the ASIC module 802 from an external source. When the chip select pin goes high data is clocked into an internal shift register via the DIN pin, as will be described below in connection with FIG. 9.

The ASIC 802 has four pins associated with an external 2.56 GHz clock (VCO 416). Typically a 20 MHz to 40 MHZ reference clock 708 is provided to the ASIC on the VIN pin (shown at 812) and the 2.56 GHz VCO 416 is provided via differential pins (shown generally at 816). These clock signals are passed to a frequency/phase comparator inside the ASIC 802, which generates a VCO correction signal 820 on a PFDOut pin. This PFDOut signal is fed back to the VCO 416 to keep it and the frame reference output 432 phase locked to the reference clock 708.

A blanking signal 828 is an active low signal that disables the output of the ASIC 802, inhibiting timing pulses from being generated.

There are two modes that the ASIC uses to latch coarse data words and control signals selected by shifting a value of one into the FE bit of the configuration shift register 920 (see FIG. 9, below). When the ASIC 802 is in FE mode it latches at the beginning of every frame. In this mode, an LE (Latch Enable) signal 832 must remain low at all times. When the ASIC is not in FE mode, LE 832 is used as an externally provided latch enable.

An A/B input 836 is used to select which internal fine delay circuits will be used to delay the coarse pulse inside the ASIC. The primary purpose of this is to allow less expensive and slower support components to be used. As an example, while the A-DAC's 843 are settling the B-DAC's 848 are in use and vise-versa. Since only one pair of DAC's needs to be stable at one time, each set of DAC's only need to run at half the speed of what a single non 'ping ponged' set of DAC's would need to run. The only inputs affected by the A/B circuitry are the In0A, In90A, IN0B, and In90B lines.

The A/B signal 836 is produced by a flipflop 854. The frame reference output signal 432 is applied to a clock input of flipflop 855 and the $\overline{Q}$ output is fed to the flipflop input. The Q output is provided to the ASIC and the A channel IQ RAM 872. Because the A and B channels function in a ping pong fashion, the Q output is provided to an inverter 856, which is used to drive the B channel IQ RAM 871.

The fine timing channels A and B introduce propagation delays causing the fine timing signals In0A, In90A, In0B, and In90B to lag the coarse delay word DC0–DC7. This delay is compensated by delaying DC0–DC7 and the E/L signal 841 via a pair of pipeline delays 860 and 858. Thus, the coarse and fine time values are synchronized using the frame reference output signal 432 as a clock input to flipflop 855 and pipeline delays 860 and 858.

Some economy can be obtained by not using the A/B function. In this case, the A/B signal 836 is tied high or low by designer's choice and only one corresponding set of DAC's is necessary, and pipeline delay blocks 858 and 860 can be eliminated. The impact on the system performance is that successive code positions cannot be closer than the DAC setup time. Although all code positions can still be reached in the LE latch mode, this configuration is typically used in a simplified system in which 50% of the code space is given up for setup time. In such a system, the delay word is latched on the rising edge of the FE signal and the first 50% of the frame (50 ns for a 100 ns frame) is not used. Codes are not generated for this region.

The MSB's from register 876 comprise the coarse delay word 724, which provides the ASIC 802 with an 8 bit parallel coarse delay value. This value selects a coarse delay window to be combined with a fine delay value produced by fine delay circuits inside the ASIC, as describe below. A pipeline delay 860 is provided to synchronize the loading of the coarse delay word 724 with the frame reference output 432, in a manner that would be apparent to a person skilled in the relevant art is view of the discussions herein.

There are five analog inputs to the fine delay circuits of ASIC 802. In0A and In90A are the IQ (sine, cosine) inputs to the A fine delay circuit, and In0B and In90B are the IQ inputs to the B fine delay circuit. The InRef 868 is an analog signal that gives a reference voltage to the IQ inputs. InRef should be set in the middle of the other analog input ranges. For example, if In0 and In90 go between 1 and 4 volts, InRef should be set for 2.5 volts.

An E/L (early/late) signal 841 is provided to select which internal coarse delay pulse the fine delay circuit will use as a reference. Inside the ASIC chip 802, as described below, the coarse delay pulse is run through a flipflop that creates a version of the signal that is delayed by a half clock cycle. The original coarse delay pulse is known as the early pulse and the delayed version is known as the late pulse. The E/L signal tells the fine delay circuit which coarse pulse to reference for creation of the final output delay. The timing of this signal is dependent on the configuration of the IQ RAM.872. Without the E/L circuitry the ASIC would not be able to cover a full 100% coding span because there is no single coarse delay pulse that is available over the entire fine delay span. The E/L signal allows for the selection of an alternate coarse delay pulse to fill in the areas that the original coarse delay pulse cannot cover.

In the implementation shown in FIG. 8, the digital values for the fine delay are the lower 8 bits of register 876. These digital values are used to look up a sine and cosine value in the IQ RAM's 872,871 and are then converted to analogue values by the DAC's 843 and 845. These analogue values are used by the ASIC 802 to generate the fine delay, as discussed in further detail below.

In an example setup, the blank signal 828 will be tied high so that the ASIC outputs are enabled. The A/B line 836 will either be high, low, or toggling with each frame depending on which analog inputs are being used. The LE line 832 will be tied low and the serial bus will be used to select FE mode. This sets the ASIC to internally latch on every clock. A 16 bit digital delay word 876 will be used to set up the ASIC for creating the delay. The most significant 8 bits of the delay word 876 will be directly used as an 8 bit coarse word 844 to be applied to the ASIC coarse word input. The least significant 8 bits will contain an address that will be sent to the IQ RAM's 872, 871. The data coming out of the I and Q RAM's for the specified address will be applied to two different DAC's. One DAC for the 0 degree signal and one DAC for the 90 degree signal. When the IQ RAM's are loaded with the shifted data table (see IQ RAM section) the most significant bit of the fine delay word will be routed to the E/L input 841 of the ASIC. The ASIC will then create a pulse at the timing output 436 delayed to match whatever value is supplied by the 16 bit delay word 808.

The present invention is preferably implemented with two fine delay systems/circuits, A and B. Having two fine delay circuits allows one circuit to be set-up while the other is being used. This allows for the use of lower cost components, while maintaining the same performance.

Figure 9:
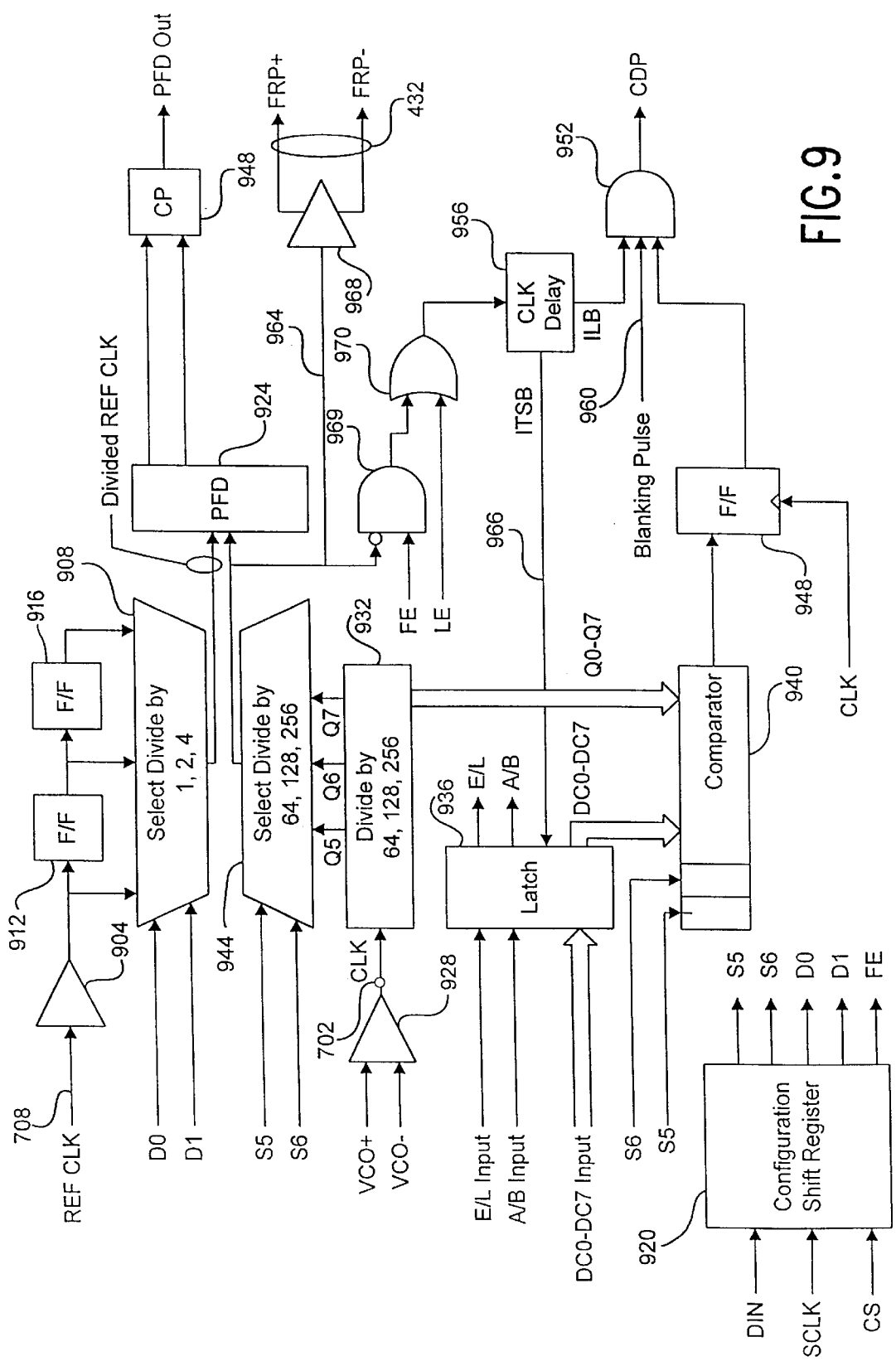
FIG. 9 illustrates a coarse timing generator in accordance with an embodiment of the present invention.

FIG. 9 illustrates the coarse timing generator 404 in greater detail in accordance with a preferred embodiment of the present invention. This embodiment contains features for adapting the operation of the timing generator for different clock rates and different modes. Referring now to FIG. 9, a configuration shift register 920 is used to set various internal states. Two inputs labeled DIN and SCLK, supply the configuration data and associated clock for storing the data in the register, respectively, when enabled by the CS (chip select). Two bits, labeled S5 and S6, are configuration bits that control the modulo size and associated divide ratio of the coarse delay system, respectively. The D0 and D1 configuration bits control the divide ratio applied to the reference clock, and an FE bit sets the delay register latch mode. When the SCLK input is applied to the configuration shift register 920, the desired values for S5, S6, D0, D1 and FE are serially applied to the DIN input and stored at successive locations in a shift register format, as would become apparent to those skilled in the art.

The detailed operation of the coarse delay system of FIG. 9 is as follows: a reference signal from the reference clock 708 passes through a buffer 904 and is received at a multiplexer (MUX) 908. The output of the buffer 904 also passes through a pair of serially connected flipflops 912 and 916, each configured to divide by two. Each flipflop provides its own output. The outputs of the flipflops 912 and 916 are received at the MUX 908. The MUX then selects one of the outputs according to the D0 and D1 inputs. Thus, the MUX can select among a direct reference clock, a divided by two and a divided by four version of this clock. The output of the MUX is fed to the frequency/phase detector (PFD) 924 as the reference clock input. The VCO 416 also goes through a selectable divide chain, which will be described later, and is supplied to the VCO input of the PFD 924. The output of the PFD 924 drives a charge pump (CP) 948 that is coupled to a loop filter 716 (see FIG. 7) that drives the VCO frequency control input to complete the phase locked loop function.

A differential clock buffer 928 receives differential inputs VCO+ and VCO− (there VCO signals are illustrated in FIGS. 4, 5 and 7 as a single VCO 416). The purpose of the clock buffer 928 is to provide isolation and common mode noise rejection of the 2.56 GHz input signal. In one embodiment, this is an input signal to an ASIC (comprising the precision timing generator on the present invention) and ground bounce isolation is desirable. The output of the clock buffer 928 is a main clock signal CLK that drives various on-chip circuits.

The CLK signal is used to drive a synchronous counter 932, which is a variable length, free running, synchronous counter. The effective length of the counter and resulting divide ratio is set by selecting one of the three most significant bits as the output bit in MUX 944. The output of the MUX 944 is called the frame signal or frame reference pulse (FRP) 964. FRP 964 is either the sixth, seventh or eight bit of the synchronous counter 932 (as selected by the S5 and S6 signals via MUX 944). The FRP is then output via a differential buffer 968 to minimize ground bounce and noise coupling. The S5 and S6 configuration bits select the counter bit that is fed to the output.

In typical operation, the input VCO clock maybe 2.56 GHz and the divide ratio may be set to 256. In this case, the divided output signal is 10 MHZ. This results in a system frame rate of 10 MHZ. In a like manner a divide ratio of 128 or 64 results in a 20 MHZ or 40 MHZ system frame rate respectively.

Latch 936 receives the coarse delay word DC0–DC7, an Early/Late (E/L) signal input, and an A/B signal input. These inputs are latched and held constant during their required operation time. An internal strobe (ITSB) signal 966 permits loading of the latch 936. The ITSB signal 955 is produced based on the FE configuration command, the frame reference pulse (FRP) 964, and the latch enable LE input signal, via logic gates 969 and 970.

A feature of the invention is an internal frame reference latching mode. In this mode, a new delay value is latched on the falling edge of the frame clock signal. In order to use the internal frame reference latching mode, FE must be stored into the shift register 920 high and LE must be held low. (LE can simply be provided as an external signal to the circuit, which is biased high or low as necessary to bypass the internal frame signal latching mode.) When FE is low a high transition of the LE signal latches the input data (i.e., A/B, EBL and DC0–DC7). Externally controlling the LE latching mode thus permits for 100% frame coverage. (100% frame coverage means that all possible coarse frame values are programmable.) This allows the setup time to be moved as necessary by this external control to keep setup time metastable effects away from the coarse time delay value. The setup time moves as a consequence of moving the LE signal. This does, however, require that the external circuitry supply the LE signal at different times in the frame to properly latch the input data. The position of the LE signal can calculated on-the-fly or precomputed and stored with the associated coarse and fine delay values.

The LE signal is used to load the latch when FE is low instead of the FRP 964. An internal blanking signal ILB blanks the CDP for two clock cycles after the ITSB signal so that if the FRP is used to latch the data, the first two coarse bins of the frame are not able to generate a CDP pulse signal. The lack of a CDP signal also inhibits the FDP output signal. The ILB signal is produced by a clock delay block 956.

Thus, LE is an asynchronous input that can occur anywhere in the frame; however, the two coarse bins after the LE edge are not available for an output pulse due to setup issues in a comparator 940 (described below). It is up to the user of the system to coordinate the position of LE with the timing input word to ensure that setup times are not violated. In one embodiment, two LE signals may be used—one delayed at least two coarse delay intervals from the other. An LE signal selection bit can be generated based on the value of the coarse delay word DC0–DC7 to select the appropriate LE signal for that coarse delay value. Either LE signal could be used as long as it is at least two coarse delay intervals before the delay value corresponding to the coarse delay word.

Figure 10:
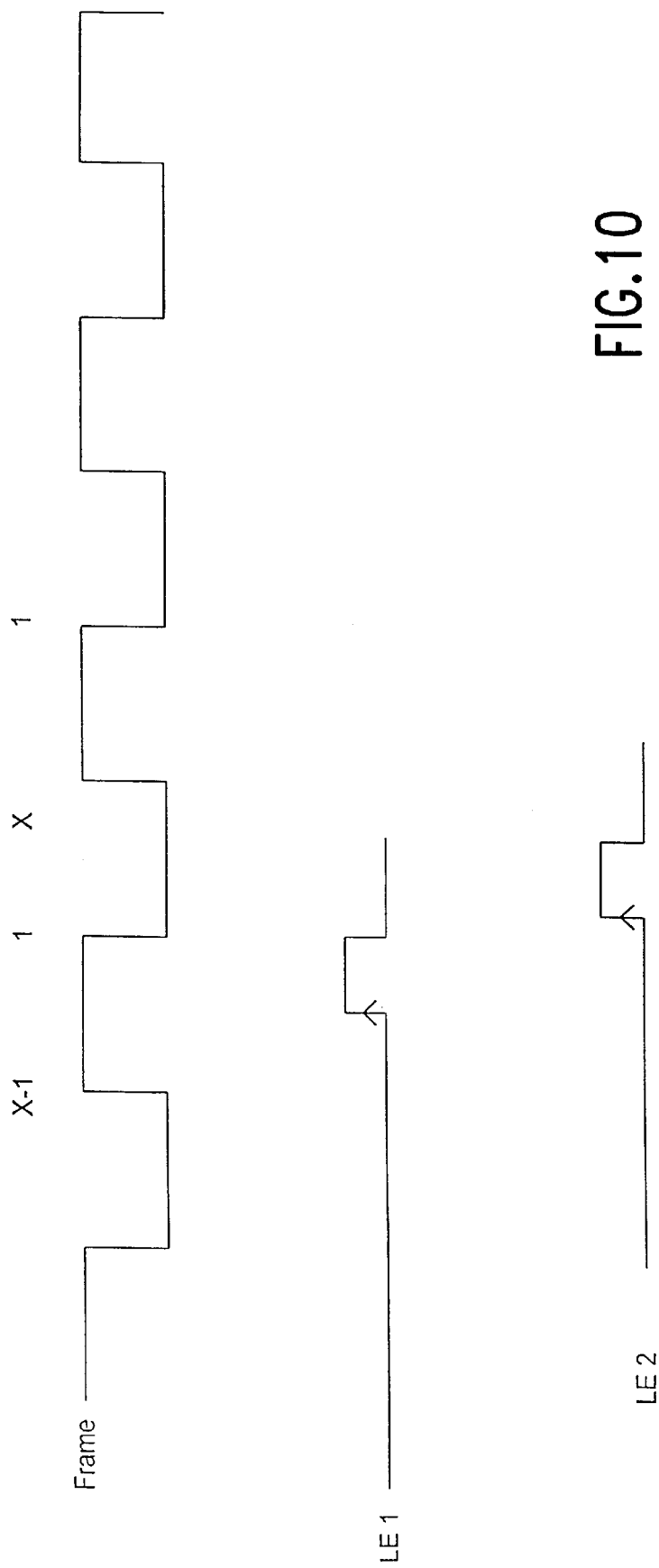
FIG. 10 illustrates latch enable timing in accordance with an embodiment of the present invention.

For example, as illustrated in FIG. 10, if the desired coarse delay (the delay value associated with the coarse delay word DC0–DC7) is in the first half of frame X, then LE 1 should be used to load the latch allowing any coarse delay value in the first half of the frame. If the desired coarse delay is in the second half of frame X, then LE 2 should be used. It should be noted that with only two choices for the LE position, there is a limitation on the minimum time spacing between successive output pulse signals. Thus, loading with LE1 prevents a pulse in the last ¼ of X-1 from being used. This prevents pulses from being closer the ½ frame from one another. If pulses must be closer than ½ frame with respect to one another, then more than two possible locations for LE must be provided by the system.

The comparator 940 forms the heart of the coarse delay function. The comparator 940 compares the necessary bits of the data word DC0–DC7, depending on the number of bits selected by the S5 and S6 bits, with the corresponding number of bits output by the counter 932.

When the value in the counter 932 matches the value in the latch 936, a coarse delay pulse (CDP) is generated. As discussed previously, S5 and S6 control the effective length of the counter. Correspondingly, they must also control the length of the comparison operation so that only the desired bits are compared. The comparator 940 compares 8, 7 or 6 bits when the divider 932 is configured to divide by 256, 128 or 64, respectively. In this manner, a CDP will be generated once every frame.

The output of the comparator 940 is received by a flipflop 948, which is clocked by the CLK signal. This resynchronizes the timing of the resulting signal. The output of the flipflop 948 is received by an AND gate 952. The AND gate 952 also receives a signal ILB from the clock delay block 956 and a blanking signal 960. The blanking signal input 960 is made available to the user to suppress the production of output pulses according to application requirements. The AND gate 952 outputs the course delay pulse (CDP). The CDP has a duration equal to one VCO time period.

Figure 11:
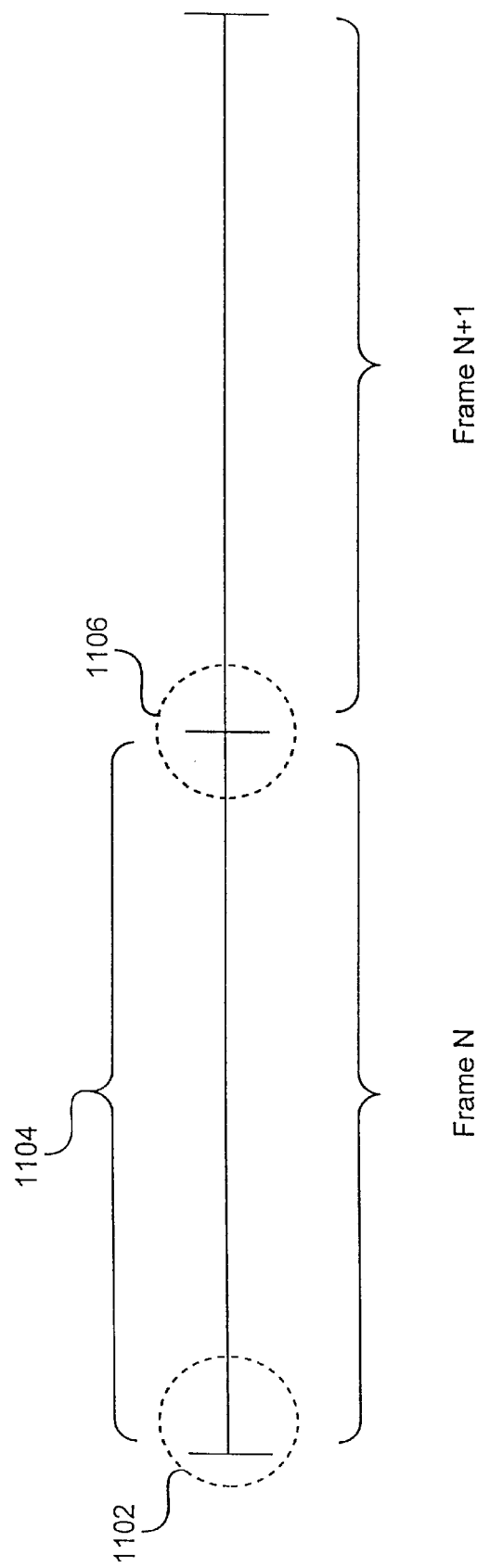
FIG. 11 illustrates latch enable, early/late and A/B system timing in accordance with an embodiment of the present invention.

FIG. 11 ties together the LE, E/L and A/B concepts. The LE timing handles latching of the coarse delay word at the beginning of each frame at 1102. The E/L timing selects which internal coarse delay pulse the fine delay circuit will use as a reference on a frame-by-frame basis at 1104. Finally, the A/B timing handles frame-to-frame fine timing set-up.

Figure 12:
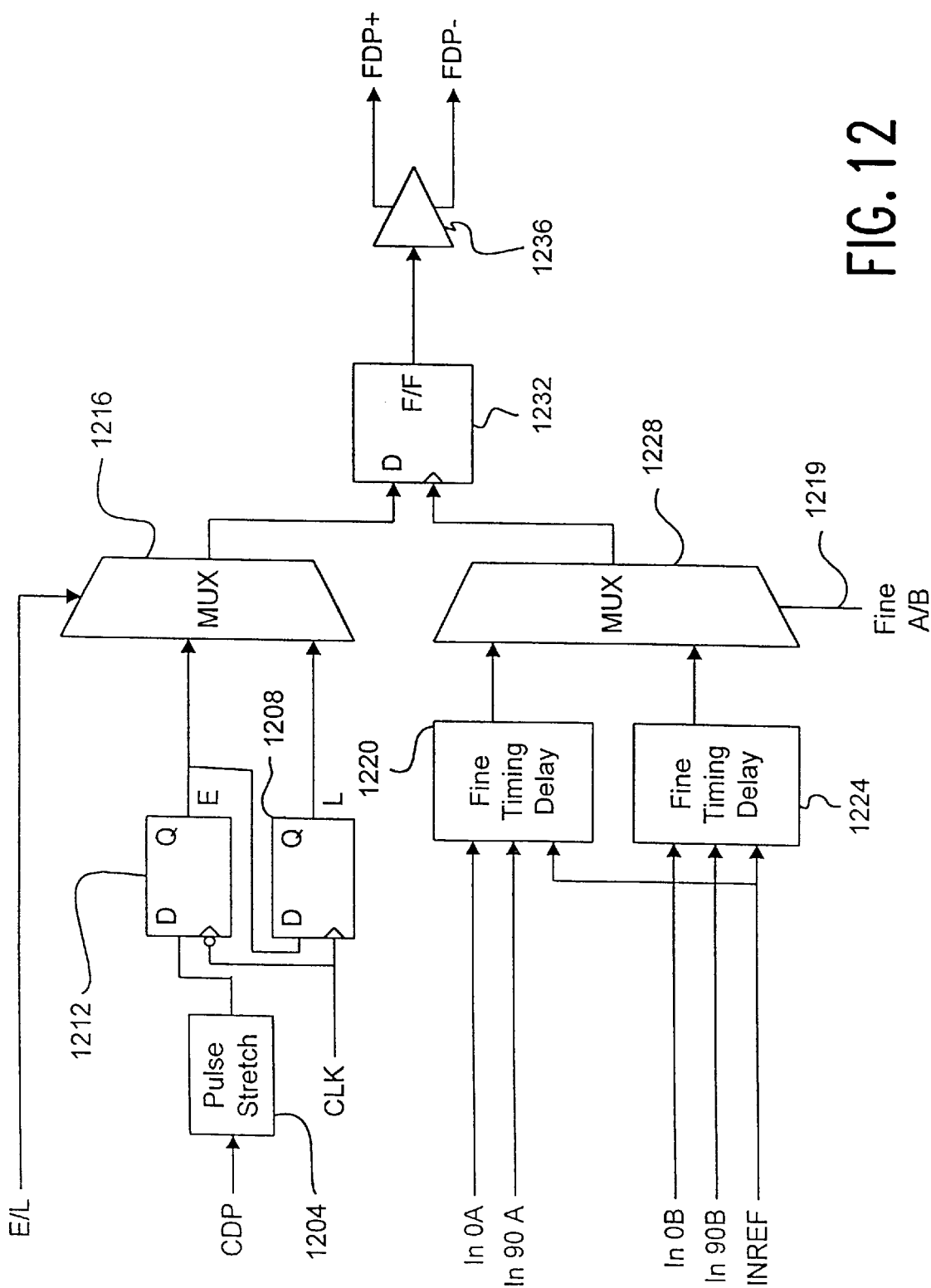
FIG. 12 illustrates a combiner circuit in accordance with an embodiment of the present invention.

FIG. 12 shows greater detail for the fine delay and combiner functions for one embodiment of the present invention. As described previously, the CDP signal has a duration of one VCO time period. This length of time is too short to drive external circuitry. A pulse stretcher 1204 is used to insure that the CDP is sufficiently long. The pulse stretcher uses the main clock signal CLK (from the clock buffer 928) to extend the length of the CDP signal.

The CDP pulse is received by a pulse stretcher 1204, which stretches the CDP by a desired amount. In one embodiment of the present invention, the pulse stretcher 1204 stretches a 400 ps CDP to a 6.4 ns pulse. The pulse stretcher 1204 is coupled to flipflop 1212, who's Q output is coupled to the D input of flipflop 1208. The stretched CDP is received by the flipflops 1208 and 1212. The flipflop 1208 is clocked by the negative edge of CLK and the flipflop 1212 is clocked by the positive edge of CLK. Each flipflop is coupled to a MUX 1216, which selects a CDP based on an early late (E/L) signal. Note that two flipflops are used here because each frame has a different delay value. In fact, the delay value can be anywhere in the 400 ps period. The E/L signal is used by the MUX 1216 to select the CDP having the correct delay. The output of the MUX 1216 is provided as the D input of a combiner flipflop 1232.

As noted above, the precision time generator comprises two fine time generators A and B, illustrated as 1220 and 1224 in FIG. 12. Two fine time generators are used to overcome the setting time required for the fine time generator inputs. For example, fine time generator 1220 is used to create a fine time delay during a first frame, while the inputs for the next frame are being furnished to fine time generator 1224. This permits the invention to achieve 100% coverage of all possible fine time delay intervals within a frame on a frame-to-frame basis.

Fine time generator 1220 is used to create the fine time portion of the time for a first frame and fine time generator 1224 is used to create the fine time delay for the next frame. Because the fine timing periods are on the order of 1.6 ps (assuming an 8 bit DAC, or 100 ns divided by $256^2$), there in not enough time for the a single fine time generator to produce the necessary fine time delay toward the end of a first frame and then received the time requirements for the next frame if the fine time delay for the next frame is at the beginning of that frame.

Fine time generator selection is performed using an A/B select signal 1219. The fine timing delay generators 1220 and 1224 are implemented using digital-to-analog converters (DAC's). The A/B select signal 1219 is provided to allow the use of slower DAC's while still maintaining the ability to provide 100% frame coverage. In this mode of operation, 1220 or 1224 is driven and allowed to settle while the delay output is being taken from the other. For the next output pulse, the first fine timing delay generators is selected and the second receives a new value and begins settling in order to produce the next frame's fine time delay.

The combiner circuit in this embodiment is an edge triggered flipflop 1232 with a clock input connected to a fine delay output signal from MUX 1228 and a data input connected to the coarse delay output signal from MUX 1216. Thus the precise timing is determined by the fine delay signal and the coarse delay signal serves only to select which fine delay transition is used. In order to accomplish this, the setup time of the flipflop 1232 must be observed. This is ensured by the E/L signal, which selects one of two alternate CDP signals via MUX 1216. The algorithm for determining the EL signal will be described later. The output of the flipflop 1232 drives a differential output buffer circuit 1236, which minimizes ground bounce and noise coupling, to produce fine delay differential outputs FDP+ and FDP−.

Figure 13:
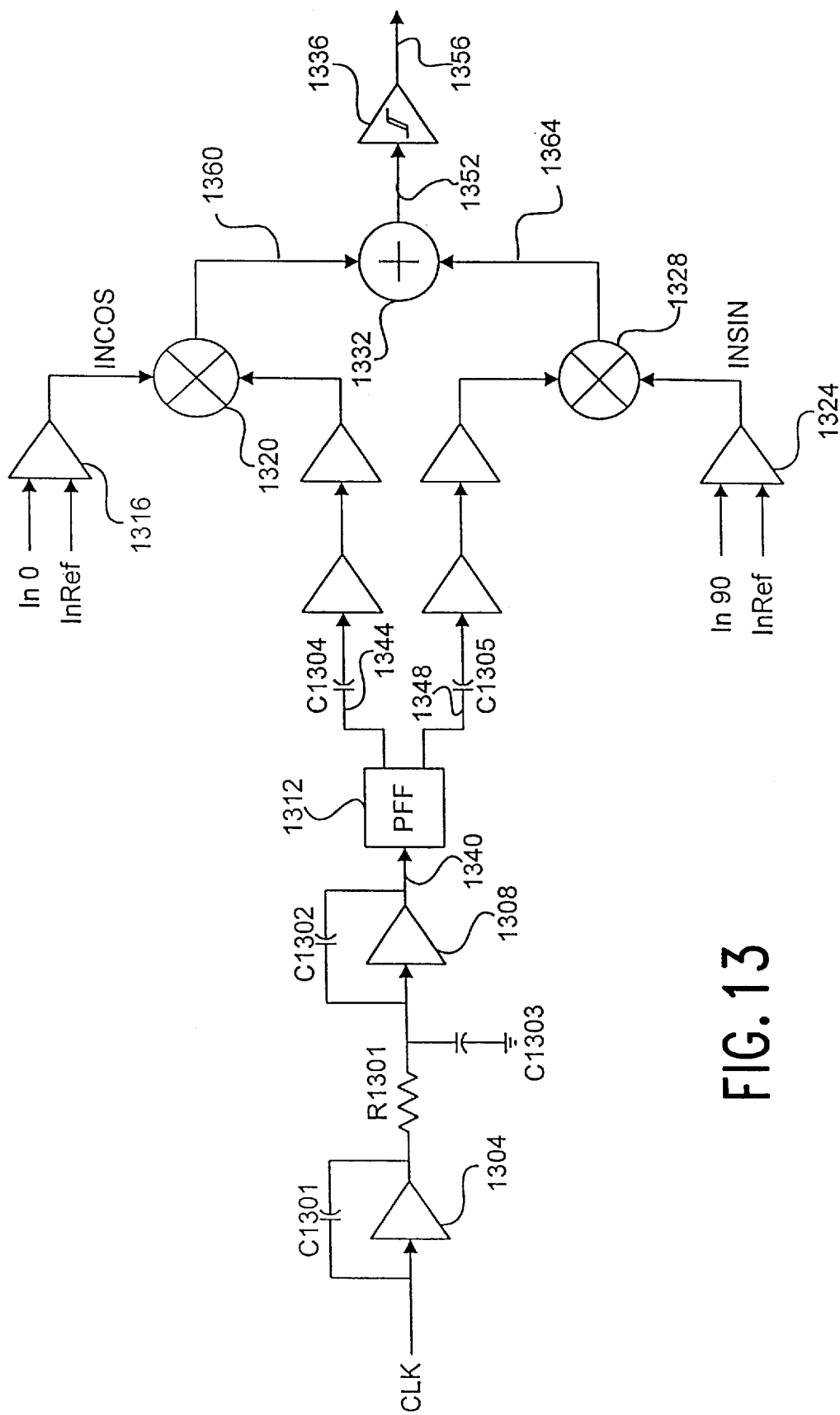
FIG. 13 is a fine timing generator in accordance with an embodiment of the present invention.

FIG. 13 illustrates one embodiment of a fine timing generator in detail. Briefly stated, this fine time generator is an I/Q modulator used for a precision delay or a phase shift. This I/Q phase shift circuit implements the standard trigonometric relationship for angle addition:

$$\sin(A+B)=\sin A \cos B+\cos A \sin B.$$

where, A represents the time dependency of the phase shifted signals 1344 and 1348:

$$A=2\pi ft,$$

(Where f is the frequency of the CLK signal, and t is time.) The angle B is the desired phase shift angle that is applied to the input of multipliers 1320 and 1328, respectively, in the form of their respective sine and cosine level signals:

IN COS=cos B=IN0−InRef

IN SIN=sin B=IN90−InRef,

Where InRef is a DC reference signal that can be used to allow IN COS and IN SIN to be unipolar signals and can also correct for circuit offsets.

Thus, $$\sin(2\pi ft+B)=\sin(2\pi ft)*IN\ COS+\cos(2\pi ft)*IN\ SIN$$

where, $\sin(2\pi ft+B)$ is the output signal 1356, $\sin(2\pi ft)*IN\ COS$ is the output 1360 of multiplier 1320, and $$\cos(2\pi ft)*IN\ SIN\ \text{is the output 1364 of multiplier 1328.}$$

Initially, three low pass filters 1304, 1308, and the RC network RC13O1/C1303 connected in series, filter the CLK signal. The low pass filters 1304 and 1308 remove the high frequency components from the CLK signal and output a sinusoidal wave. A poly-phase filter 1312 is coupled to the filter 1308 to receive the sinusoidal wave and outputs a sine wave (Sin 2 πft) 1344 and a cosine wave (Cos 2 πft) 1348. At an amplifier 1316, a signal IN COS=cos B (B is the desired delay phase shift angle) is received. Also, at an amplifier 1324 a signal IN SIN=sin B, is received. A multiplier 1320 receives IN COS and Sin 2 πft and outputs the product signal 1360. Multiplier 1328 receives IN SIN and Cos 2 πft and outputs the corresponding product signal 1364. A summer 1332 coupled to the multipliers 1320 and 1328 receives their respective product signals and outputs Sin(2 πft+B). The output 1352 of the summer 1332 is, thus, a sinusoidal wave having the desired delay B. A comparator 1336 receives Cos(wt-tB) from the summer 1332 and outputs a square wave clock having the desired delay B, as shown at 1356. The circuit components can introduce additional phase shifts, but careful circuit design and a calibration step described herein can eliminate these phase shifts.

Figure 14:
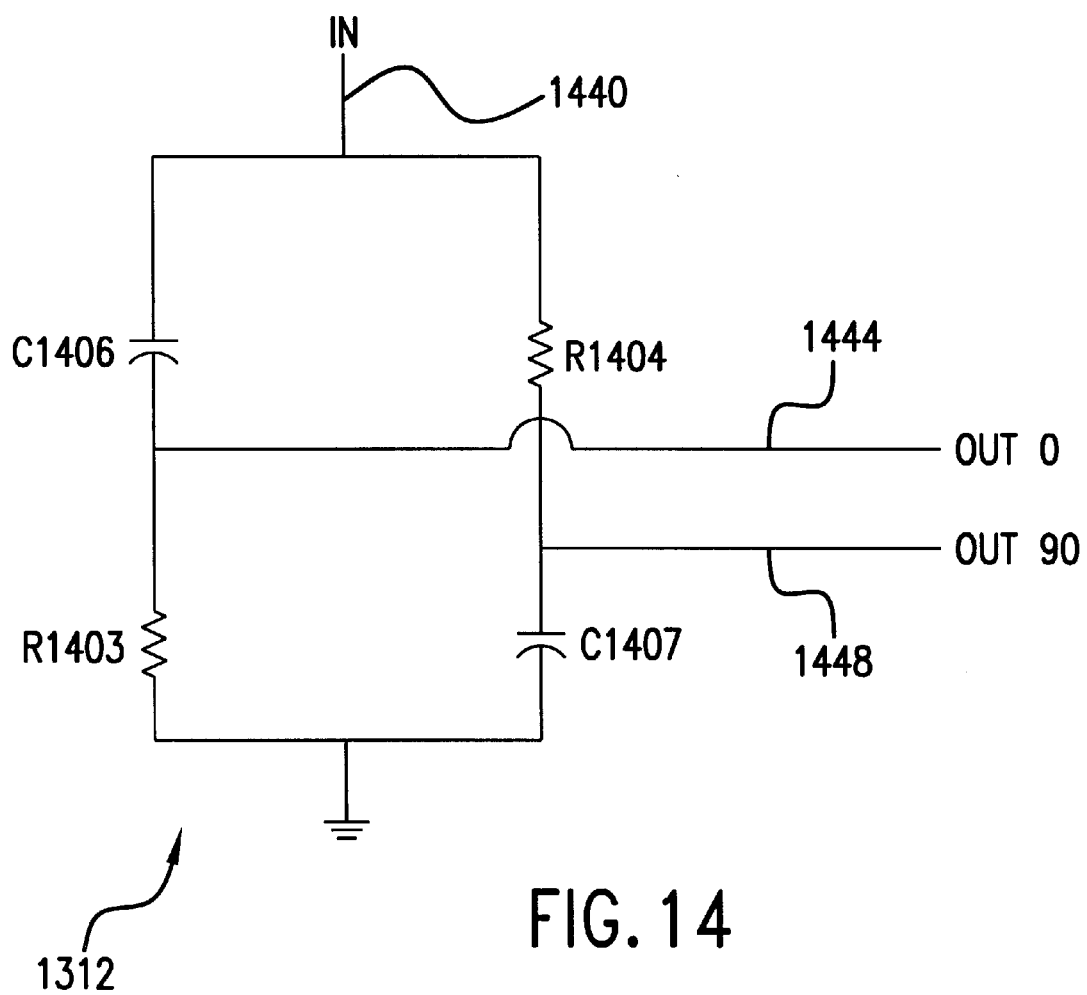
FIG. 14 illustrates an exemplary poly-phase filter that can be used for the phase locked loop for FIG. 13.

FIG. 14 depicts an exemplary ploy-phase filter that can be used for the PFF function of FIG. 13. In this figure, C1306 and R1303 form a lead network that shifts the output signal 1344 45 degrees ahead of the input signal 1340. This output signal is labeled OUT0 for convenience. R1304 and C1307 form a lag network that shifts the output signal 1348 45 degrees behind the input signal 1340. This output signal is labeled OUT90 for convenience. The input drive must be low impedance and the output load must be high impedance so that it will not load the phase network.

Figure 15:
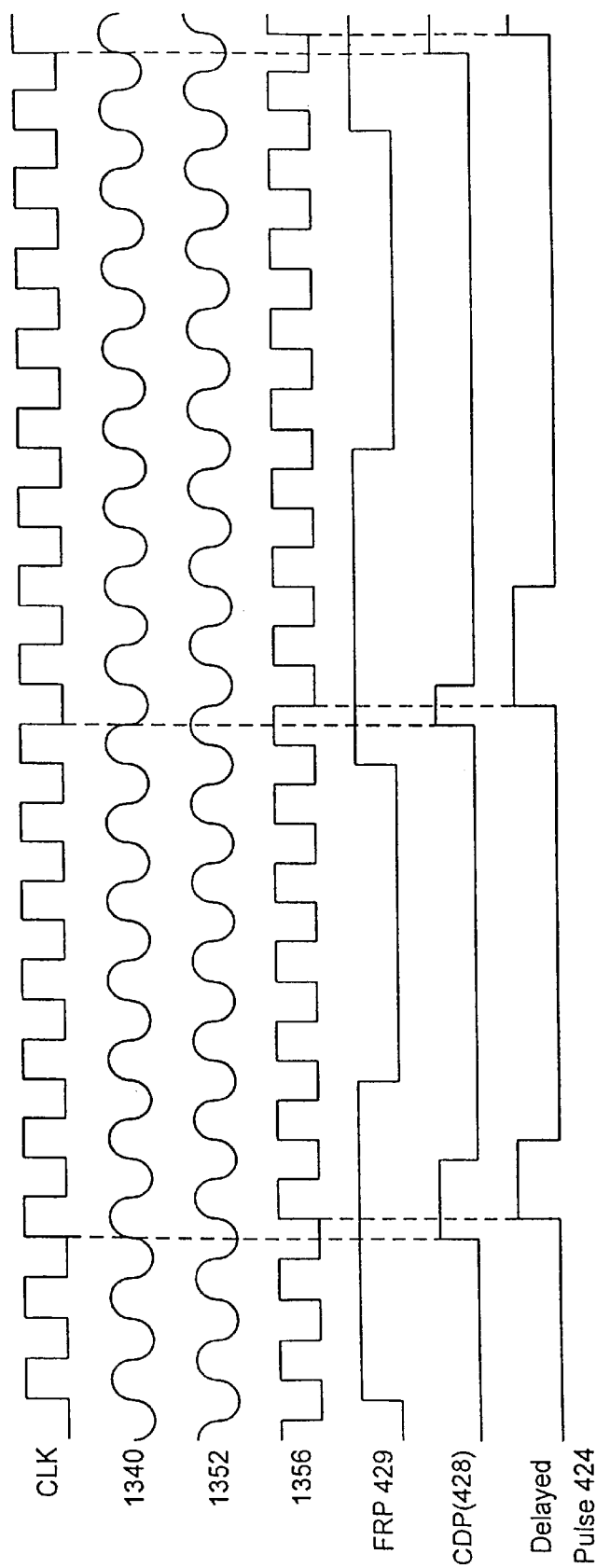
FIG. 15 is a timing diagram illustrating the basic operation of the combiner circuit of FIG. 12.

FIG. 15 is a timing diagram illustrating the basic operation of the fine delay and combiner circuit in accordance with one embodiment of the present invention. Referring now to FIGS. 13 and 15, the CLK signal input is filtered by filter circuits 1304 and 1308 with associated components. This filter removes harmonic energy from the square wave CLK signal and results in a near sine wave signal 1340. This sine wave signal can have some fixed phase shift as a result of this filtering, but is shown synchronous with CLK for simplicity. The sine wave signal is shifted by the phase shift network 1312, 1320, 1328, 1332. This results in a shifted sine wave 1352. This shifted sine wave is amplified and level shifted as necessary to convert back to a logic clock in amplifier 1336. Schmidt trigger style positive feedback may be helpful for this function.

The FRP signal 432 represents a frame time during which only one output pulse will be generated. The CDP signal 428 signal is the output of the coarse delay generator and is synchronous with CLK. It too can have a fixed phase offset from CLK, but is shown synchronous for simplicity. The delayed pulse 429 results from the first rising edge of the fine delay output 1356 after the CDP signal goes high. It can be appreciated that the fine positioning of the output pulse is primarily dependent on the fine delay signal and that jitter in the edge of the CDP signal should be attenuated to only second order effects as long as setup times are adequate. The CDP acts to select which edge of the fine delay signal is active.

Figure 16:
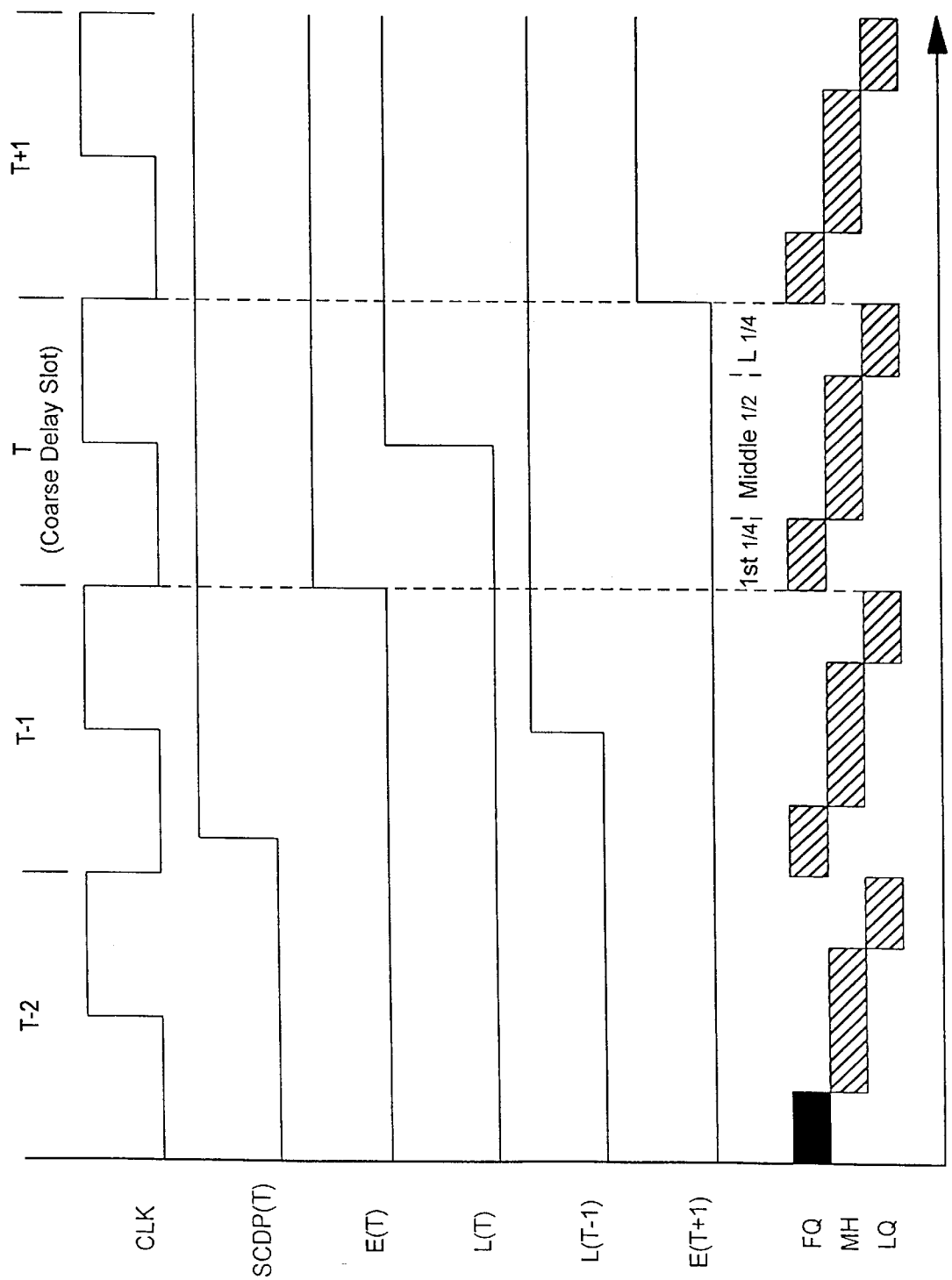
FIG. 16 is a timing diagram illustrating the details of the early/late signal in accordance with an embodiment of the present invention.

FIG. 16 is a timing diagram illustrating the details of the early/late (E/L) signal discussed above in connection with FIGS. 9 and 12. The E/L signal is used to position the fine delay pulse (FDP) anywhere in the coarse delay interval (also called a slot or bin) with 100% coverage. Since the fine delay pulse rising edge can be anywhere in the coarse delay interval, there is some range of fine delay values that fall too close to the metastable range of the combiner flipflop 1232 to yield accurate results. To solve this problem, two reclocked versions of the stretched CDP (output of pulse stretcher 1204) are created. As illustrated in FIG. 12, an early version (E) is created by flipflop 1212 on the falling edge of CLK. A late version (L) is created by flipflop 1208 on the rising edge of CLK. Either the E or the L signal is selected by MUX 1216 using E/L as the MUX control signal. The output of MUX 1216 is used as the D input of the combiner flipflop 1232.

FIG. 16 shows the timing relations of the above signals. CLK is the clock signal with a period of 100/256 ns (=390 ps), which is the result of dividing a 100 ns frame into 256 coarse delay intervals (via data word DC0–DC7). SCDP(T) is the stretched coarse delay pulse for delay time T. Delay time T means the value T, 0<=T<256, is loaded into the latch 936 (via coarse data word DC0–DC7) at the beginning of the frame (in internal FE latch mode.) E(T) is the early pulse if T was loaded. L(T) is the late pulse if T was loaded. Also shown are L(T−1) is the late pulse if T−1 is used and E(T+1) is the early pulse for T+1.

If the desired output is to occur in the first ¼ of the coarse delay slot each rising edge of the fine delay MUX 1228 will be in a hashed area of the line labeled FQ in FIG. 16. For the FDP rising edge to be in the first quarter of time T then it can be seen that L(T−1) should be used as the D input to flipflop 1232. This requires that the latch 936 is loaded with T−1 and the E/L should be set to select L.

If the desired output is to occur in the middle half of the coarse delay slot, each rising edge of the fine delay MUX 1228 will be in a hashed area of the line labeled MH in FIG. 16. For the FDP rising edge to be in the middle half of time T, then it can be seen that E(T) should be used as the D input to 1232. This requires that the latch 936 is loaded with T and the E/L should set to select E.

If the desired output is in the last quarter of the coarse delay slot, each rising edge of the fine delay MUX 1228 will be in a hashed area of the line labeled LQ in FIG. 16. For the FDP rising edge to be in the last quarter of time T then it can be seen that L(T) should be used as the D input to 1232. This requires that the latch 936 is loaded with T and the EIL should be set to select L.

The above insures that the clock of the Flipflop 1232 is at least a quarter of a coarse delay time from the D input, avoiding any set up or hold violations.

There are fixed delays in the fine delay generator (1220, 1224 and 1228) due to propagation delays, phase shifts in the clock to sine wave converter and other sources. These delays are removed using calibration by adding a fixed offset, which is determined by locating the metastable point and then adjusting the sine/cosine RAM tables to place this point in a predetermined address location. The metastable point may be found by setting E/L to E then varying the digital fine delay value while monitoring the FDP. At some value of the fine delay, the output FDP will jump a time equal to one coarse delay. This point gives the sine and cosine values needed for zero time delay. This error can be corrected either by adding (modulo the number of fine delay bins per coarse delay interval) an offset to the digital fine delay or by rotating the contents of the sine/cosine RAM's such that an address value of zero points to the location found in the above calibration procedure.

The sine/cosine RAM table can also correct for other errors such as nonlinearities or periodic errors due to an imperfect 90 degree phase shift between the sine and cosine signals or departures from an ideal sine function in the waveforms. This can be accomplished by running a calibration sweep and storing the corrected values in the appropriate RAM instead of the ideal sine and cosine values described above.

In another embodiment, a simpler E/L may be implemented by shifting the contents of the IQ RAM's an amount equal to ¼ of a coarse delay time such that a zero digital value makes the clock occur ¼ of a clock pulse into the coarse delay. This shift is in addition to the calibration step described above.

Figure 17:
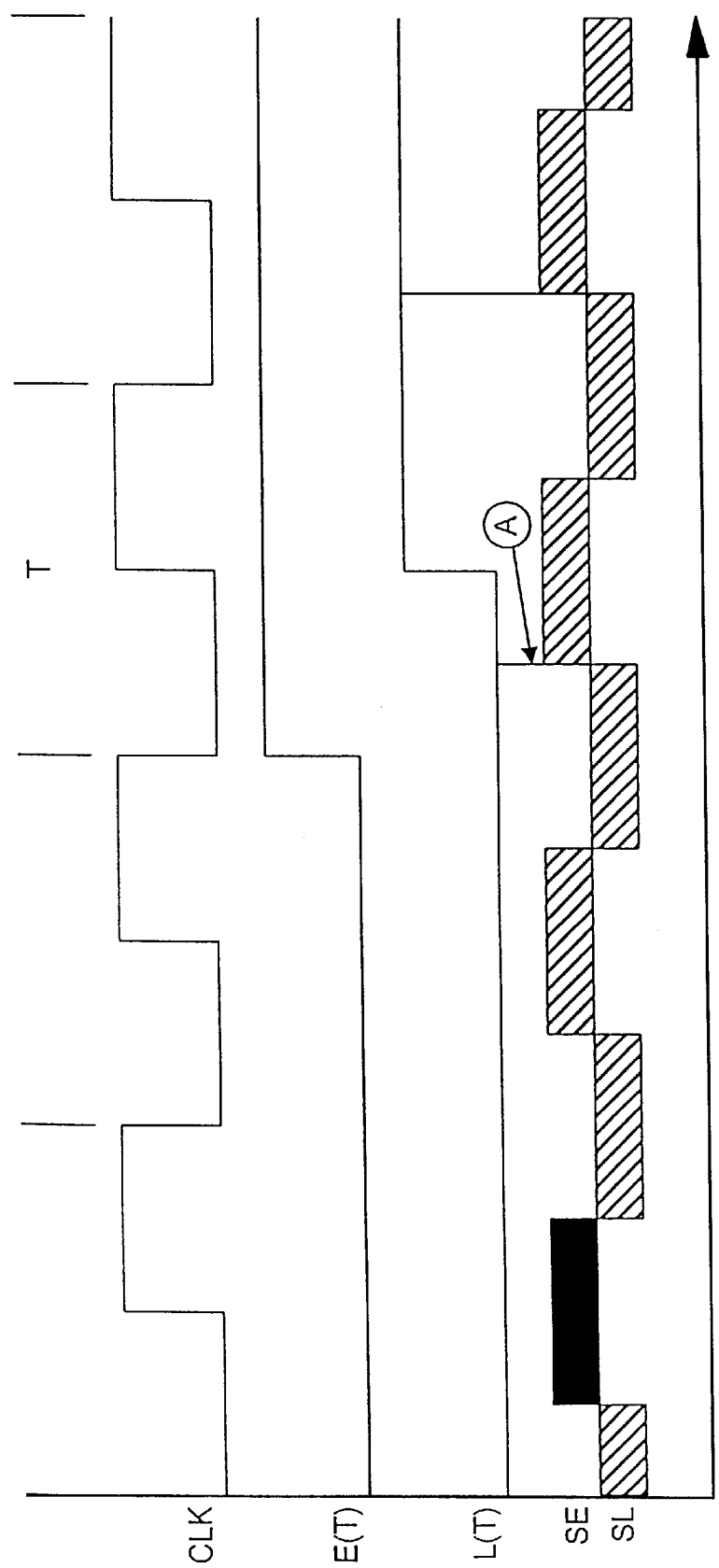
FIG. 17 is a timing diagram illustrating further details of the early/late signal.

The resulting clock edge at RAM address zero is labeled A in FIG. 17. When this is done, if the desired fine delay is in the first half of the values so the rising edge of the fine delay clock is in the hatched area of line SE of FIG. 17, a value of T will be loaded for the coarse delay, as above, and E(T) will be used as the D input. If the desired fine delay is in the second half, as in SL of FIG. 17, a value of T will be loaded and L(T) will be used. Note that only the value T is used and the E/L signal is the upper bit of the fine delay value from register 876. This scheme also insures that the clock of the flipflop 1232 is at least a quarter of a coarse delay time from the D input—avoiding any set up or hold violations.

Figure 18:
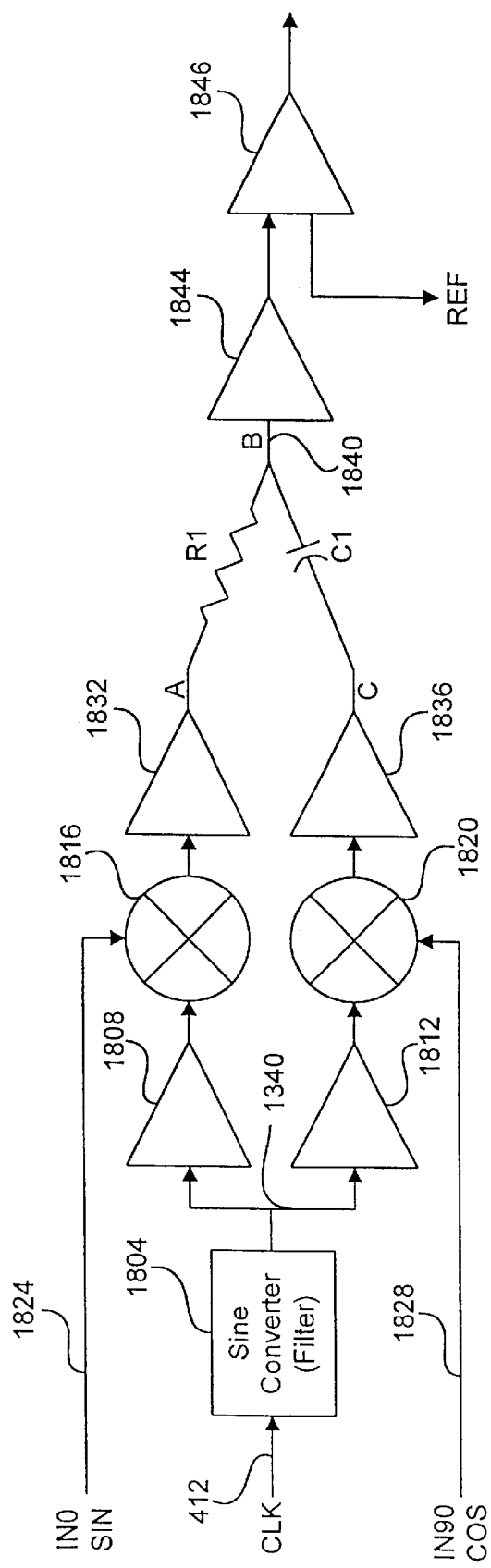
FIG. 18 illustrates an alternate fine timing generator in accordance with another embodiment of the present invention.

FIG. 18 illustrates an alternate I-Q phase shift approach for fine timing. The digital CLK input is converted to a sine wave, typically by filtering (note that 1804 is same as FIG. 13 1304–1308). This output can be buffered 1808, 1812, and then is applied to two analog multipliers 1816, 1820. The multipliers 1816, 1820 are controlled by a DC level representing the sine and cosine of the desired phase shift angle (In0 and In90). The outputs of the multipliers 1816, 1820 are then in-phase sine waves with relative amplitudes proportional to the respective sine and cosine values applied to the multipliers. Buffers 1832, 1836 are used to assure that the multiplier outputs have a near zero impedance as they are fed to the RC network comprising R1 and C1. The top sine wave lags 45 degrees from point A to B. The bottom sine wave leads 45 degrees from point C to B. The result is two sine waves 90 degrees out of phase forming a phase shifter based on the same math as FIG. 13. The summed signal 1840 is then high impedance amplified at 1844 to avoid loading the RC circuit. This signal is fed to a comparator 1846 (see the same function performed by Schmidt trigger 1336 in FIG. 13) or other high gain stage to convert the sine wave to a digital signal.

Figure 19:
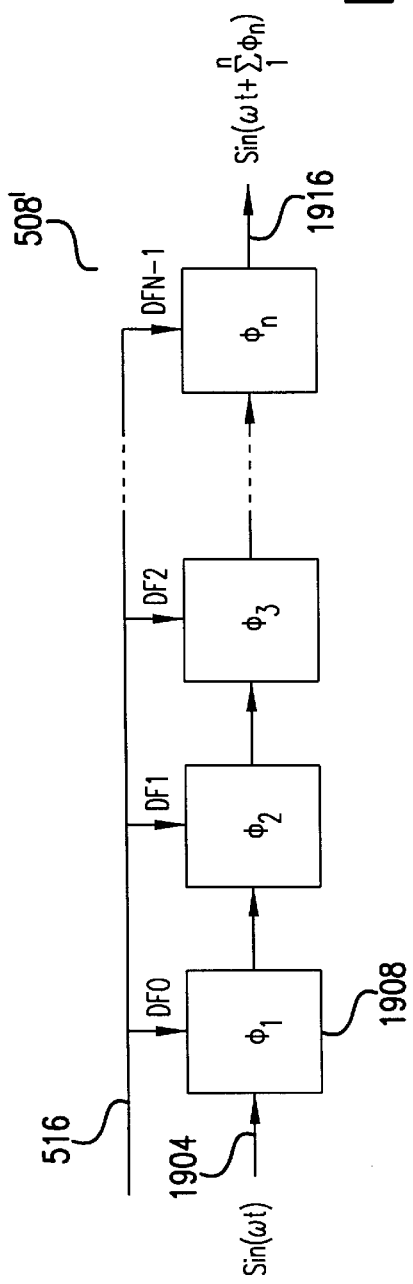
FIGS. 19 and 20 illustrate a further alternate fine timing generator in accordance with another embodiment of the present invention.

FIG. 19 shows an alternate phase shifter block 508. In this embodiment, the timing command signal is a parallel set of digital signals representing respective phase shift values. These values are configured to be binary weighted values for convenience in some systems, but this is not necessary. In one embodiment, a memory device is included to map true timing command values (LSB's from 1676 DF0–DFN-1) to actual sets of phase shifts ($\phi$1–$\phi$n). These values (DF0–DFN-1) can be calculated during a calibration step in the manufacture of an individual device and stored in the memory for that device.

In FIG. 19, the input signal 1904 is a sine wave with no phase shift. Signal 1904 passes through each phase shifter 1908 and accumulates additional phase shift according to the digital command input (D0, etc.) for that stage. The output signal 1916 is a sine wave with the sum of the phase shifts from all of the stages 1908, each stage contributing phase shift according to its respective digital command D0–DN-1 bit input.

Figure 20:
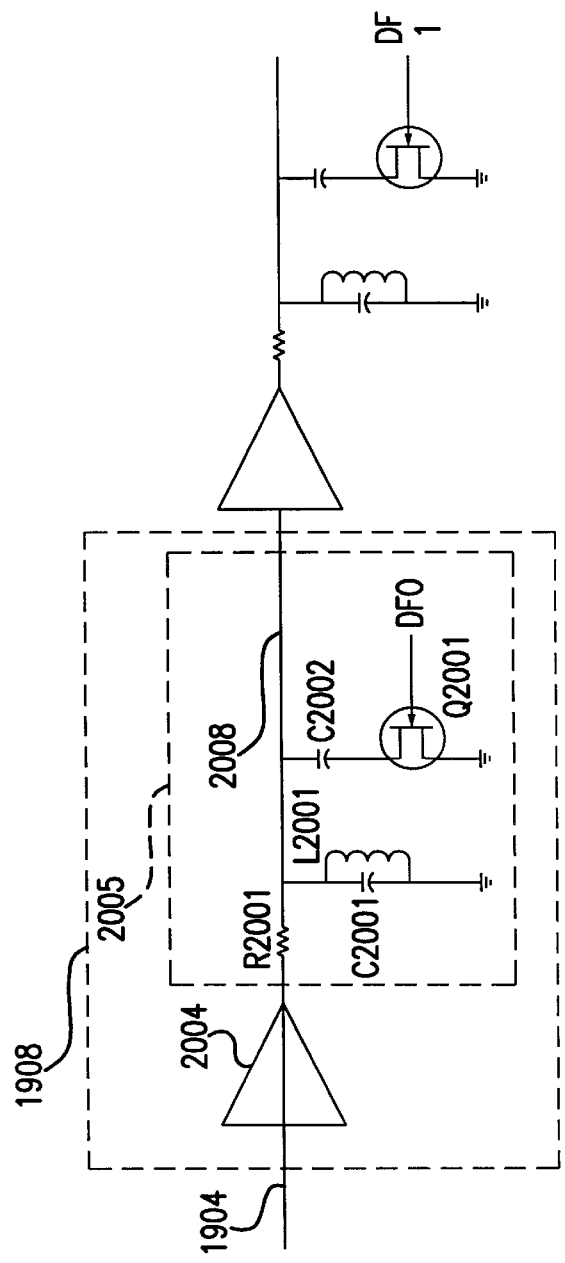

FIG. 20 shows an example phase shift stage 1908 that can be used in FIG. 19. In FIG. 20, the input signal 1904 is buffered by buffer 2004 and fed to the following RLC network shown generally at 2005. This network forms a resonant circuit near the sine wave frequency of the input signal at 1904. The Q of this circuit is ideally in the neighborhood of 1, that is R=XL=XC, where R is the value of R2001, XL is the reactance of L2001, and XC is the reactance of C2001. This low Q is desirable to minimize settling time in response to the transients associated with changing the phase shift command. Use of the RLC CKT 2005 also minimizes sensitivity to component tolerances and drift.

Transistor Q2001 is operated as a switch. When Q2001 is off, the phase of the signal at 2008 is determined by R2001, C2001, and L2001. When the Q2001 is on (closed), C2002 is added in parallel and detunes the circuit, shifting the phase. In practice, for best operation, the two phase shift states should be adjusted such that the amplitude of the signal at 2008 is the same for both phase states. This operation generally involves trimming both C2001 and C2002. Q2001 should be a device with low parasitic capacitance. To extend operation to the highest frequencies, GaAs MESFET devices can be used, (such as NE76118.) (A phase shift circuit of this type was operated by the inventors at a sine wave frequency of 120 MHZ.) This is an unusual use for these devices because they are normally thought of as being used for low noise front end amplifiers to 18 GHz. Their data sheets do not characterize them for use as digital devices; however, because of their 0.1 pf parasitic capacitance, they make near ideal devices for this application. Typical discrete FETs and transistors have much greater parasitic capacitance, however, in an ASIC implementation, very small junction conventional FET's, or the like, can be specified to minimize parasitic capacitance.

Numerous variations are possible, for instance, the switch may be placed in the inductive path rather than in the capacitive path; 180 degree phase shifts may be achieved by selecting an inverted signal. The RLC network can be configured in the emitter, or collector circuits of an amplifier; several switched capacitors can be coupled to one RLC circuit—especially for low value phase shifts. These variations are presented by way of example. Numerous other variations are possible within the scope of the present invention, as may be appreciated by one skilled in the art.

Figure 21A:
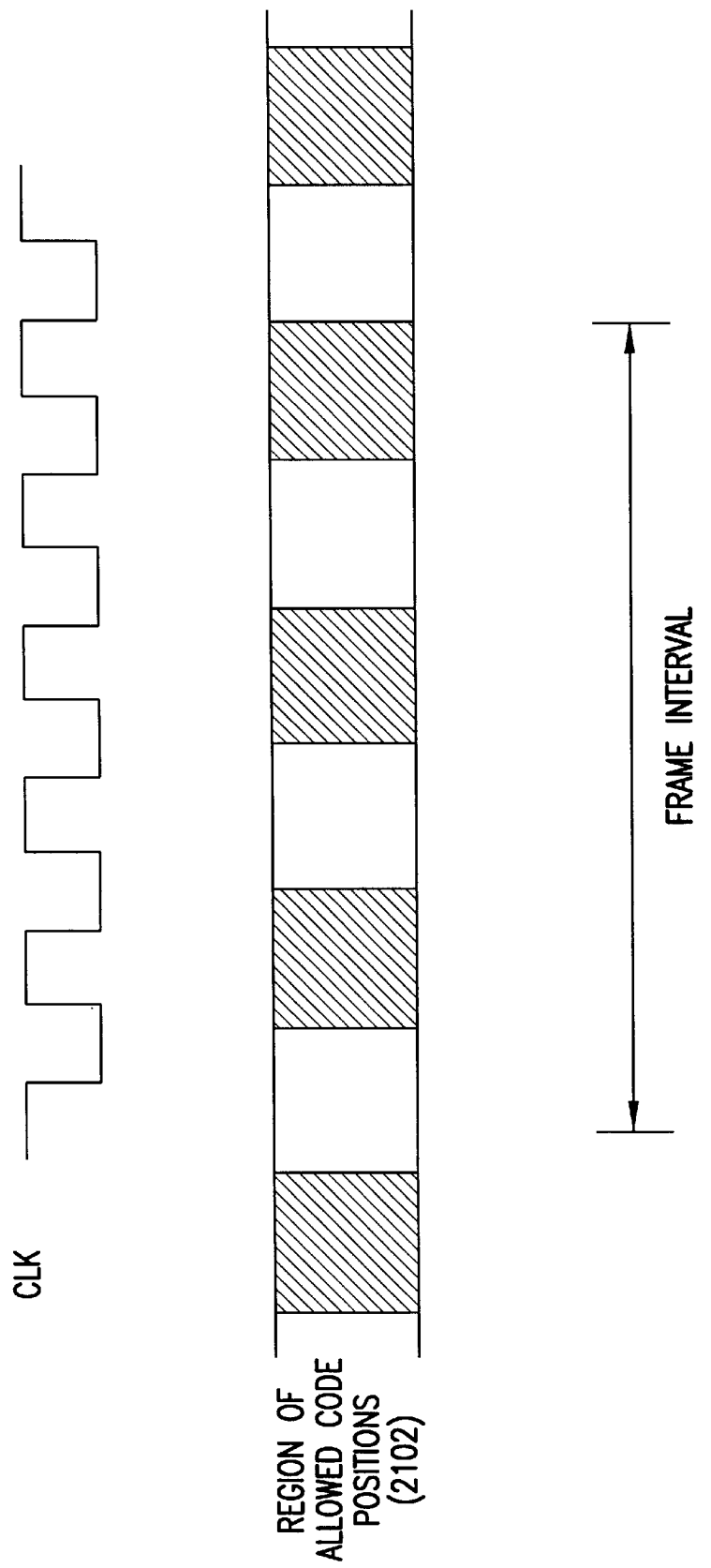

The system can be designed without the E/L·function. The advantage would be slightly less complexity, which is virtually transparent in an ASIC implementation, but may be significant in a discrete implementation. The impact would be that code positions near the combiner flipflop 1232 metastable point would not be available. This results in a repetitive "comb" shape code availability pattern, as illustrated in the "Region of Allowed Code Positions" in FIG. 21A.

Figure 21B:
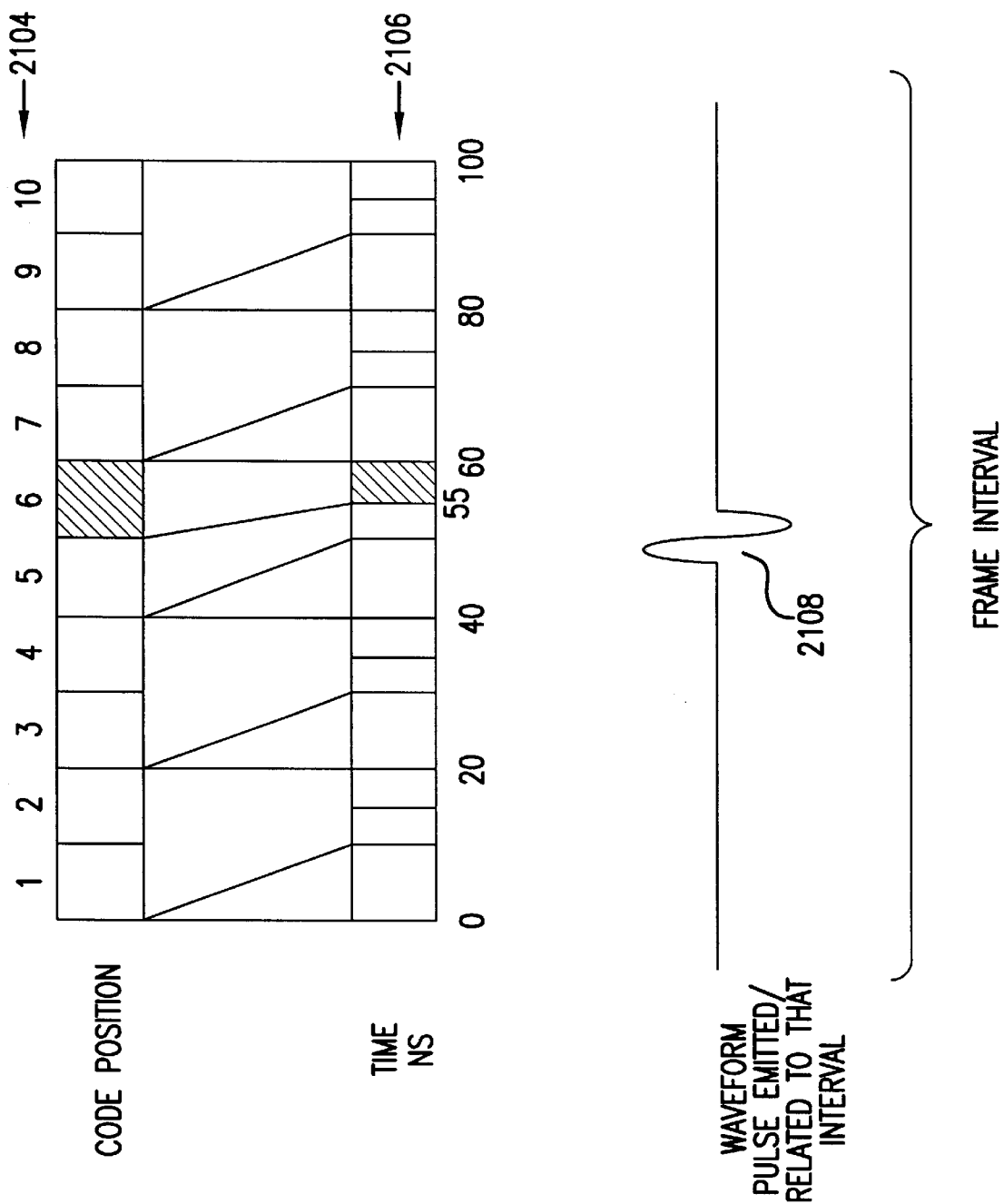

As shown in the figure, the shaded repetition periods 2102 are synchronous with the CLK period, but avoid the metastable points adjacent the falling edge of the CLK. One frame interval is shown with several codes, but hundreds of codes can map to a single frame. A code pattern of this type, however, can be mapped so as not to damage the correlation properties of the channelization code. Such a mapping arrangement is illustrated in FIG. 21B. A linear segment of codes 2104 is linearly mapped to a segment of delay space such that the delay space bins are ½ or less the spacing they would be with 100% coverage. Example code positions 1–10 are listed are mapped to time positions 2106 (0–100 ns per a single frame). Code position 6 is mapped to the interval between 55–60 ns and a emitted pulse 2108 is timed according to this code mapping.

In this situation, the correlation and autocorrelation properties may be analyzed in two regimes as shown in FIG. 21C. For any time slip between the two patterns 2110 and 2112, there are two regions: an overlap region (B) and two non-overlap regions (the A's and C's) for each comb "finger." In the overlap region B, code correlation properties can be analyzed using conventional test methods or mathematics, which assumes no gaps in the mapping. That is because incremental bins (n, n+1,n+2 . . . ) from one signal line up with incremental bins from the correlated signal in the same order that they would with no gaps in the code mapping. In the non-overlap regions (D), there is no correlation. For a given time slip, only a fraction of the sites have an opportunity to correlate and no sites line up out of order with their corresponding non-gapped mapping. Thus, the correlation must be equal or less than that for non-gapped mapping.

The penalty for this advantage is that the bins are ½ size or less, which means there are ½ or less as many of the same size available. The bins must be kept larger than the waveform for the correlation properties to be maintained. The net result is slightly poorer performance, but a slight economy in hardware may be obtained.

Figure 22:
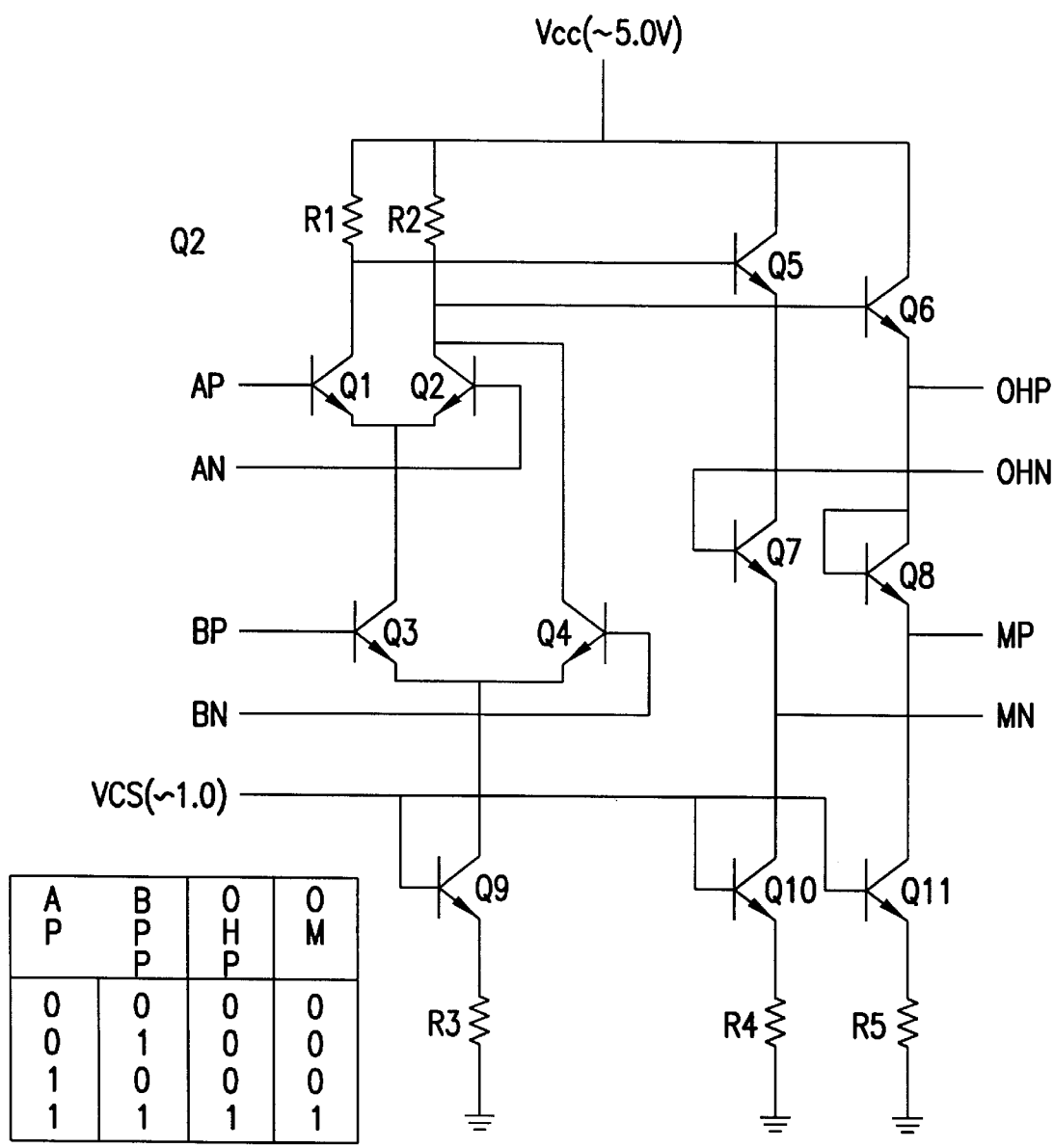
FIG. 22 illustrates an example SiGe differential AND gate for the ASIC in accordance with another embodiment of the present invention.

FIG. 22 is a representative differential AND gate illustrating typical current steering logic that can be used to minimize noise in an ASIC implementation of the present invention. The circuit comprises two differential pairs Q1–Q2 and Q3–Q4. There are two differential input pairs AP, AN and BP, BN. Two emitter follower and level shifting stages Q5 and Q6 follow the differential stages. Q7 and Q8 provide another level shift. OHP and OHN are used to drive the top stage (like Q1 and Q2) of the next level of logic. OMP and OMN are used to drive the bottom stage (like Q3 and Q4) of the next level of logic. Q10 and Q11 are the current sources for the emitter followers and level shifters. All current sources are biased with a control voltage VCS.

In operation, the current generated by current source Q9 is steered to R1 when both AP is positive with respect to AN and BP is positive with respect to BN; otherwise, it is steered to R2. This results in OHP (and OMP) being more positive than OHN (and OMN) only when AP and BP are high. This is an AND gate by definition.

Since the current are always flowing and just steered to R1 or R2 the current drawn by the circuit is independent of the input resulting in low transients due to power supply current variations. This concept can be extended to have three levels of logic and three output levels to make optimum use of the supply voltage in an ASIC implementation.

4. Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention as defined in the claim(s). Among other reasons, this is true in light of (later) developing technology and terms within the relevant art(s). Thus the present invention should not be limited by any of the above-described exemplary embodiments, but should be defined only in accordance with the following claims and their equivalents.

What is claimed is:

1. A precision timing generator, comprising:
    a coarse timing generator that receives a clock signal and a timing command input and generates a coarse timing signal;
    a fine timing generator including a sine generator and a phase shifter, wherein the sine generator receives the clock signal and generates a sine wave signal (Sin 2 πft), and wherein the phase shifter receives the sine wave signal (Sin 2 πft) and the timing command input and phase shifts the sine wave signal (Sin 2 πft) based on a fine timing component of the timing command input to generate a phase shifted sine wave signal (Sin 2 πft+B) having a desired phase shift (B);
    a converter that converts the phase shifted sine wave signal into a square wave signal having the desired phase shift (B), wherein the square wave signal comprises a fine timing signal; and
    a combiner that uses the fine timing signal and the coarse timing signal to generate precision timing signal.

2. The precision timing generator of claim 1, wherein the fine timing component of the timing command input comprises:
    an analog DC level signal representing a sine of the desired phase shift (sin B); and
    an analog DC level signal representing a cosine of the desired phase shift (cos B).

3. The precision timing generator of claim 2, wherein the phase shifter comprises:
    a first multiplier that multiplies the cosine of the desired phase shift (cos B) and the sine wave signal (Sin 2 πft), and outputs a first product signal;
    a second multiplier that multiplies the sine of the desired phase shift (sin B) and the sine wave signal (Sin 2 πft), and outputs a second product signal; and
    a resistor capacitor (RC) circuit adapted to add the first product signal and the second product signal, and output the phase shifted sine wave signal (Sin 2 πft+B) having a desired phase shift (B).

4. The precision timing generator of claim 3, wherein the first and second product signals comprise in-phase sine waves with relative amplitudes proportional to the cosine of the desired phase shift (cos B) and the sine of the desired phase shift (sin B).

5. The precision timing generator of claim 3, wherein the RC circuit is adapted to cause the first product and the second product to be added 90 degrees out of phase with respect to one another.

6. The precision timing generator of claim 3, wherein the timing command input comprises a data word specifying a desired delay value.

7. The precision timing generator of claim 6, wherein at least a portion of the data word defines the fine timing component of the timing command input.

8. The precision timing generator of claim 7, wherein the fine timing component of the timing command input is defined by a fine delay word.

9. The precision timing generator of claim 8, wherein the phase shifter further comprises:
    a sine lookup table that converts the fine delay word to sine value;
    a cosine lookup table that converts the fine delay word to a cosine value;
    a first digital to analog converter (DAC) that converts the sine value to the analog DC level signal representing the sine of the desired phase shift (sin B); and
    a second digital to analog converter (DAC) that converts the cosine value to the analog DC level signal representing the cosine of the desired phase shift (cos B).

10. The precision timing generator of claim 2, wherein the phase shifter comprises:
    a filter that receives the sine wave signal (Sin 2 πft) and outputs a cosine signal (Cos 2 πft) and a further sine wave signal (Sin 2 πft);
    a first multiplier that multiplies the cosine of the desired phase shift (cos B) and the further sine wave signal (Sin 2 πft), and outputs a first product signal;
    a second multiplier that multiplies the sine of the desired phase shift (sin B) and the cosine signal (Cos 2 πft), and outputs a second product signal; and
    a summer that adds the first product signal and the second product signal, and outputs the phase shifted sine wave signal (Sin 2 πft+B) having the desired phase shift (B).

11. The precision timing generator of claim 10, wherein the timing command input comprises a data word specifying a desired delay value.

12. The precision timing generator of claim 11, wherein at least a portion of the data word defines the fine timing component of the timing command input.

13. The precision timing generator of claim 12, wherein the fine timing component of the timing command input is defined by a fine delay word.

14. The precision timing generator of claim 13, wherein the phase shifter further comprises:
   a sine lookup table that converts the fine delay word to a sine value;
   a cosine lookup table that converts the fine delay word to a cosine value;
   a first digital to analog converter (DAC) that converts the sine value to the analog DC level signal representing the sine of the desired phase shift (sin B); and
   a second digital to analog converter (DAC) that converts the cosine value to the analog DC level signal representing the cosine of the desired phase shift (cos B).

15. The precision timing generator of claim 1, wherein said fine timing signal subdivides said course timing intervals into smaller intervals having discrete resolution.

16. The precision timing generator of claim 1, wherein said fine timing signal subdivide said fine timing intervals into smaller intervals having continuously variable resolution.

17. The precision timing generator of claim 1, wherein the coarse timing generator also generates a frame reference signal, and wherein said fine timing signal comprises a series of fine timing signal transitions placed in time relative to said frame reference signal according to said timing command input.

18. The precision timing generator of claim 17, wherein said combiner selects one of said fine timing signal transitions according to said coarse timing signal and outputs said precision timing signal.

19. A method for generating a precision timing signal, comprising the steps of:
   generating a coarse timing signal based on a clock signal and a timing command input;
   generating a sine wave signal (Sin 2 πft) based on the clock signal;
   phase shifting the sine wave signal (Sin 2 πft) based on a fine timing component of the timing command input to thereby generate a phase shifted sine wave signal (Sin 2 πft+B) having a desired phase shift (B);
   converting the phase shifted sine wave signal (Sin 2 πft+B) into a square wave signal having the desired phase shift (B), wherein the square wave signal comprises a fine timing signal; and
   generating the precision timing signal based on the fine timing signal and the coarse timing signal.

20. The method of claim 19, wherein the fine timing component of the timing command input comprises:
   an analog DC level signal representing a sine of the desired phase shift (sin B); and
   an analog DC level signal representing a cosine of the desired phase shift (cos B).

21. The method of claim 19, further comprising the step of generating a frame reference signal based on the clock signal and the timing command input, and wherein said fine timing signal comprises a series of fine timing signal transitions placed in time relative to said frame reference signal according to said timing command input.

22. The method of claim 19, wherein said step of generating said precision timing signal comprises the step of: selecting one of said fine timing signal transitions according to said coarse timing signal.

23. The method of claim 19, further comprising the step of generating a frame reference signal based on the clock signal and the timing command input, and wherein said step of generating said coarse timing signal comprises the steps of:
   counting pulses of said clock signal to generate a clock count value that defines said coarse time interval;
   dividing said clock signal into a lower-rate signal that comprises said frame reference signal;
   comparing a predetermined count value to said clock count value as said clock count value increments, wherein said predetermined count value corresponds to a desired coarse time interval; and
   changing a state of said coarse timing signal when said clock count value matches said predetermined count value.

24. The method of claim 23, wherein said coarse timing signal comprises a coarse timing pulse.

25. The method of claim 24, further comprising the step of using said coarse timing signal to enable said fine timing generator to trigger at a next interval.

26. A method for generating a precision timing signal based on a timing command input that includes a fine timing component, comprising the steps of:
   a. generating a coarse timing signal based on a clock signal and the timing command input;
   b. generating a sine wave signal (Sin 2 πft) and a cosine signal (Sin 2 πft) based on the clock signal;
   c. generating an analog DC level signal representing a sine of a desired phase shift (sin B) based on the fine timing component of the timing command input;
   d. generating an analog DC level signal representing a cosine of the desired phase shift (cos B) based on the fine timing component of the timing command input;
   e. multiplying the sine wave signal (Sin 2 πft) by the DC level signal representing the cosine of the desired phase shift (cos B) to produce a first product signal;
   f. multiplying the cosine wave signal (Cos 2 πft) by the DC level signal representing the sine of the desired phase shift (sin B) to produce a second product signal;
   g. adding the first product signal and the second product signal to produce a phase shifted sine wave signal (Sin 2 πft+B) having the desired phase shift (B);
   h. converting the phase shifted sine wave signal (Sin 2 πft+B) into a square wave signal having the desired phase shift (B), wherein the square wave signal comprises a fine timing signal; and
   i. generating the precision timing signal based on the fine timing signal and the coarse timing signal.

27. The method of claim 26, wherein:
   the fine timing component of the timing command input is defined by a fine delay word;
   step (c.) comprises the steps of (c.i) using a sine lookup table to convert the fine delay word to a sine value; and (c.ii) converting the sine value to the analog DC level signal representing the sine of the desired phase shift (sin B); and
   step (d.) comprises the steps of (d.i) using a cosine lookup table to convert the fine delay word to a cosine value; and (c.ii) converting the cosine value to the analog DC level signal representing the cosine of the desired phase shift (cos B).

28. A method for generating a precision timing signal based on a timing command input that includes a fine timing component, comprising the steps of:

a. generating a coarse timing signal based on a clock signal and the timing command input;

b. generating a sine wave signal (Sin 2 πft) based on the clock signal;

c. generating an analog DC level signal representing a sine of a desired phase shift (sin B) based on the fine timing component of the timing command input;

d. generating an analog DC level signal representing a cosine of the desired phase shift (cos B) based on the fine timing component of the timing command input;

e. multiplying the sine wave signal (Sin 2 πft) by the DC level signal representing the cosine of the desired phase shift (cos B) to produce a first product signal;

f. multiplying the sine wave signal (Sin 2 πft) by the DC level signal representing the sine of the desired phase shift (sin B) to produce a second product signal;

g. adding the first product signal and the second product signal to produce a phase shifted sine wave signal (Sin 2 πft+B) having the desired phase shift (B);

h. converting the phase shifted sine wave signal (Sin 2 πft+B) into a square wave signal having the desired phase shift (B), wherein the square wave signal comprises a fine timing signal; and i. generating the precision timing signal based on the fine timing signal and the coarse timing signal.

29. The method of claim 28, wherein the first and second product signals comprise in-phase sine waves with relative amplitudes proportional to the cosine of the desired phase shift (cos B) and the sine of the desired phase shift (sin B).

30. The method of claim 28, wherein step (g.) comprises adding the first product signal and the second product signal using a resistor capacitor (RC) circuit adapted to cause the first product and the second product to be added 90 degrees out of phase with respect to one another.

\* \* \* \* \*